US010620861B2

(12) United States Patent
Balasubramonian et al.

(10) Patent No.: US 10,620,861 B2
(45) Date of Patent: Apr. 14, 2020

(54) RETRIEVE DATA BLOCK FROM DETERMINED DEVICES

(71) Applicant: Hewlett Packard Enterprise Development LP, Houston, TX (US)

(72) Inventors: Rajeev Balasubramonian, Palo Alto, CA (US); Paolo Faraboschi, Palo Alto, CA (US); Gregg B. Lesartre, Fort Collins, CO (US); Naveen Muralimanohar, Santa Clara, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/500,594

(22) PCT Filed: Apr. 30, 2015

(86) PCT No.: PCT/US2015/028576
§ 371 (c)(1),
(2) Date: Jan. 31, 2017

(87) PCT Pub. No.: WO2016/175842
PCT Pub. Date: Nov. 3, 2016

(65) Prior Publication Data
US 2017/0220256 A1 Aug. 3, 2017

(51) Int. Cl.
*G06F 3/06* (2006.01)
*G06F 12/02* (2006.01)
(Continued)

(52) U.S. Cl.
CPC .............. *G06F 3/064* (2013.01); *G06F 3/061* (2013.01); *G06F 3/0656* (2013.01);
(Continued)

(58) Field of Classification Search
CPC ........ G06F 3/064; G06F 3/061; G06F 3/0656; G06F 3/0683; G06F 11/1068; G11C 29/52
See application file for complete search history.

(56) References Cited

U.S. PATENT DOCUMENTS

| 8,738,860 B1* | 5/2014 | Griffin | G06F 12/0897 711/122 |
| 2005/0160234 A1* | 7/2005 | Newburn | G06F 12/0802 711/144 |

(Continued)

FOREIGN PATENT DOCUMENTS

| WO | WO-11048400 | 4/2011 |
| WO | WO-12082880 | 6/2012 |
| WO | WO-2012158521 | 11/2012 |

OTHER PUBLICATIONS

G. Pekhimnko et al., "Linearly compressed pages: A low-complexity, low-latency main memory compression framework," 2013 46th Annual IEEE/ACM International Symposium on Microarchitecture (MICRO), Davis, CA, 2013, pp. 172-184. (Year: 2013).*

(Continued)

*Primary Examiner* — Eric Cardwell
(74) *Attorney, Agent, or Firm* — Hewlett Packard Enterprise Patent Department

(57) ABSTRACT

Techniques for retrieving data blocks from memory devices are provided. In one aspect, a request to retrieve a block of data may be received. The block of data may be in a line in a rank of memory. The rank of memory may include multiple devices. The devices used to store the line in the rank of memory may be determined. The determined devices may be read.

10 Claims, 15 Drawing Sheets

(51) Int. Cl.
*G06F 12/14* (2006.01)
*G06F 11/10* (2006.01)
*G11C 29/52* (2006.01)

(52) U.S. Cl.
CPC ........ *G06F 3/0683* (2013.01); *G06F 11/1048* (2013.01); *G06F 12/0238* (2013.01); *G06F 12/1408* (2013.01); *G06F 11/1068* (2013.01); *G06F 2212/1028* (2013.01); *G06F 2212/1044* (2013.01); *G06F 2212/401* (2013.01); *G06F 2212/7208* (2013.01); *G11C 29/52* (2013.01); *Y02D 10/13* (2018.01)

(56) References Cited

U.S. PATENT DOCUMENTS

| | | | |
|---|---|---|---|
| 2006/0101206 A1* | 5/2006 | Wood | G06F 12/0802 711/122 |
| 2011/0191546 A1* | 8/2011 | Qureshi | G06F 12/00 711/144 |
| 2014/0156611 A1 | 6/2014 | Sainath | |
| 2014/0208014 A1 | 7/2014 | Voutilainen et al. | |

OTHER PUBLICATIONS

Hajimiri et al—Content-aware Encoding for Improving Energy Efficiency in Multi-Level Cell Resistive Random Access Memory—http://esl.cise/ufl.edu—2013—6 PAGES.

International Searching Authority, The International Search Report and the Written Opinion, PCT/US2015/028576, dated Apr. 22, 2016, 13 Pages.

Pekhimenko et al—Linearly compressed pages: a low-complexity, low latency main memory compression framework—MICRO-46-2013-2 pages.

Shafiee et al., "MemZip: Exploring Unconventional Benefits from Memory Compression", 2014 IEEE 20th International Symposium on High Performance Computer Architecture, 2014, 12 pages.

Pekhimenko et al., "Base-Delta-Immediate Compression: Practical Data Compression for On-Chip Caches", Proceedings of the 21st international conference on Parallel architectures and compilation techniques, 2012, 12 pages.

\* cited by examiner

US 10,620,861 B2

RETRIEVE DATA BLOCK FROM DETERMINED DEVICES

BACKGROUND

Electronic devices, such as computers, may include memory. For example, a computer may include static random access memory (SRAM) and dynamic random access memory (DRAM). SRAM and DRAM share the characteristic power must be continuously supplied in order to retain data stored in the memory. If the power is removed, the stored data may be lost. Another type of memory that is becoming more prevalent is non-volatile random access memory (NVRAM). NVRAM may have the characteristic that once data is stored to the NVRAM, the data remains persistent, even if power is no longer supplied to the device.

DETAILED DESCRIPTION

Figure 1:
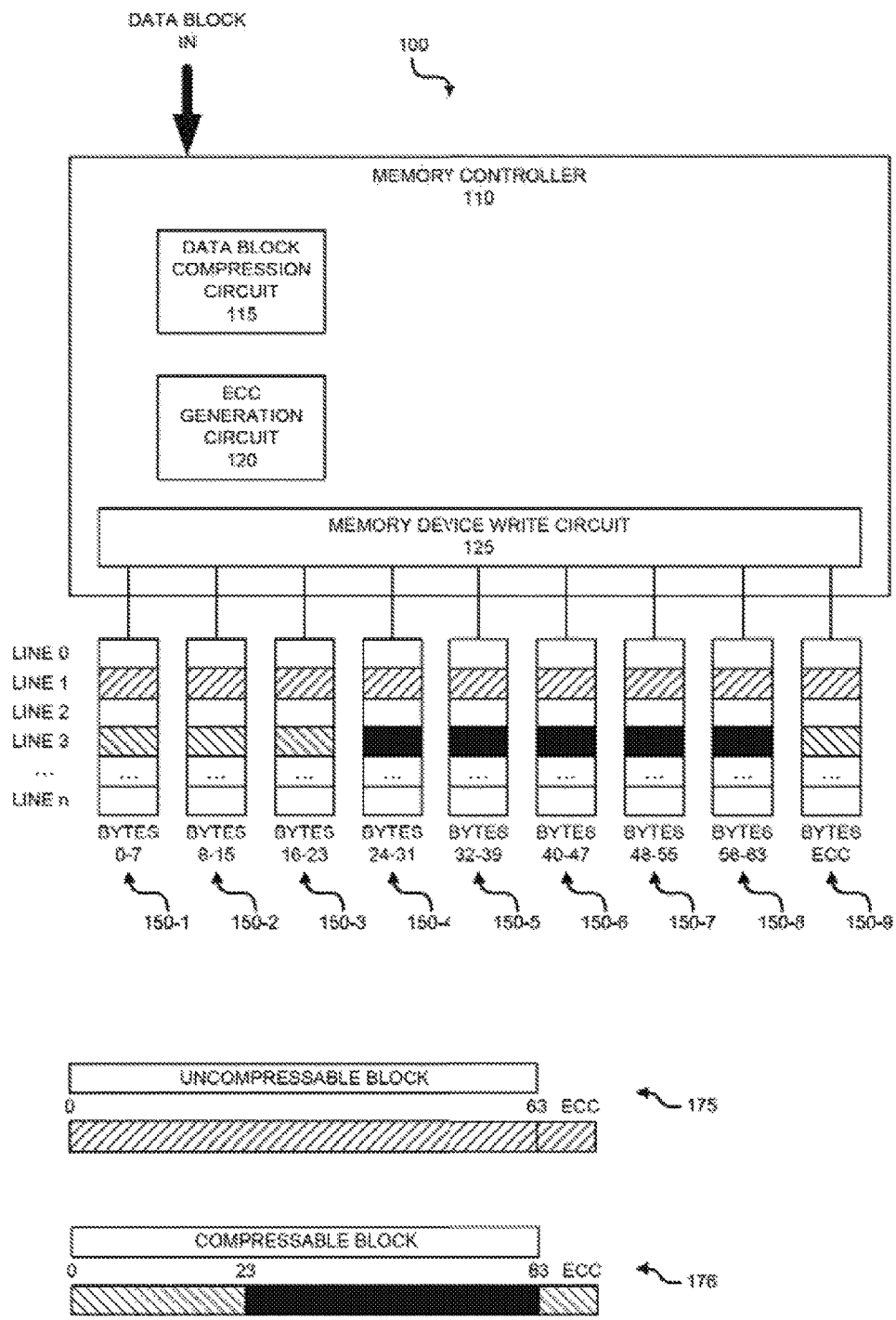
FIG. 1 depicts an example of a device that may use the data writing to a subset of memory devices techniques described herein.

As mentioned above, some memory components in an electronic device, such a SRAM and DRAM require power in order to maintain storage of data. Other devices, such as NVRAM are able to store data without the need to continuously supply power. However, even though power is not needed to retain the persistence of the data, power is needed when the data is originally written. Currently existing forms of NVRAM (e.g. FLASH memory) as well as new types of NVRAM currently being developed (e.g. memristor, phase change RAM, spin torque transfer RAM) do not require the continuous supply of power in order to maintain the persistence of data stored thereon. However, these devices do use power when originally writing the data to the device. This use of power may be referred to as write energy. It should be understood that SRAM and DRAM also require write energy to store data, and as such the techniques described herein are equally applicable to SRAM and DRAM.

Many electronic devices, such as computers, include a memory controller to manage storing and retrieving data from memory. The memory controller may not individually read and write bytes of data from the memory. Rather, the memory controller may operate on groups of bytes, referred to as a line of data. For example, in a computer, memory is typically operated on in units equivalent to the size of a cacheline in the processor. For example, if a processor has a cacheline size of 64 bytes, the memory controller may receive/provide data to the processor in units of 64 bytes. However, techniques described herein are not limited to any particular cacheline size. For the remainder of this description a line may refer to a data block that is provided to the memory controller to be written to memory or is provided by the memory for use by the electronic device. The techniques described herein are not limited to any particular line size.

The memory may be divided across several memory devices which may be referred to as a rank. For example, for a given line, the memory devices that store the data that make up the line are all in the same rank. A rank of memory devices may store multiple lines. For example, for a 64 byte line, there may be 9 memory devices in the rank. Each of the first 8 memory devices (e.g. a memory chip) may store 8 bytes of the line. The $9^{th}$ memory device may be used to store an Error Correction Code (ECC). The nine memory devices that make up the rank may store large numbers of lines. Although a specific example of a rank of memory is described, it should be understood that the techniques described herein are not limited to any particular layout of memory devices in a rank.

The techniques described herein provide for receiving a line of data to be written to memory. The line may be examined to determine if the line can be compressed. If so, the line may be compressed, and a header describing the compression may be added to the line. An ECC for the overall line may be calculated. The compression may result in fewer than the total number of memory devices within the rank being needed to store the compressed line. As such, the memory devices that are not needed are not written, thus saving the write energy that would have otherwise been used to write to those devices. In some cases the data may be encrypted prior to being written to the memory devices.

The line that is stored may contain the data needed to determine if the line is compressed, and if so, how the line should be decompressed. For example, if the ECC does not use all bits available on the ECC storage device for the line, then the extra bits may be used to indicate if the line is compressed or not. In other implementations, different techniques, described below, may be used to determine if the line is compressed. When the data is to be read, it may be determined if the line is encrypted and/or compressed. The line may then be decrypted and/or decompressed and provided to the requestor.

The techniques described herein are Operating System (OS) independent and as such the OS is not required to have any knowledge of the compression occurring in the memory system. In other words the techniques described herein are completely transparent to the OS, applications, or other software running on the system. No OS, application, or other code modification is required.

In one example implementation, writes to the memory devices are based on a mapping. Instead of always writing a compressed block to the rank of memory in the same order, a mapping may be used. For example, if a compressed line would use four memory devices to store the line, the mapping would determine which four devices are used. By using the mapping, it can be ensured that the first memory devices in the rank are not always selected.

Because the writes to memory devices are spread based on the mapping, it may be possible to increase memory write bandwidth by performing multiple writes in parallel. For example, if a first line is to be stored on the first three memory devices and a second line is to be stored on the last three memory devices, the lines may be written in parallel. Because there is no overlap in the memory devices used, each device can be commanded to write a different line. Furthermore, the mapping may even out power dissipation of the memory devices. Using the techniques described herein, power may be dissipated over all the devices in a more even manner, because the mapping ensures that the same set of memory devices are not always used.

The techniques described thus far allow for reduced write energy by limiting the number of memory devices that are written when a data block is compressed. The techniques also allow for the particular memory devices used to be determined by a mapping, which allows for multiple data blocks to be written in parallel if different memory devices are used for each of the blocks. The techniques described herein may also reduce the amount of energy used for a read of the memory devices.

As mentioned above, writing data to a memory device uses power, and that power use may be proportional to the number of memory devices that are being written. Likewise, reading data from the memory devices also uses power, and the power used may be proportional to the number of memory devices that are read. The techniques described herein further provide for a mechanism to predict which memory devices need to be read in order to retrieve a block of data. The prediction may be made based on historical access patterns or an actual record of memory devices used.

When a block of data is read, the predicted memory devices may be determined and those devices read. An attempt may then be made to recover the original data block (e.g. by decompressing/decrypting). If the prediction was correct, the recovery process may be successful. There may a savings in read energy, as all of the memory devices did not need to be read. If the prediction is incorrect, the remaining memory devices may then be read, and the recovery process may be attempted again. Thus, the techniques described herein provide for the ability to reduce the amount of read energy used when retrieving a block of data by predicting the actual memory devices used in storing the block, rather than blindly reading all memory devices in the rank.

FIG. 1 depicts an example of a device that may use the data writing to a subset of memory devices techniques described herein. System 100 may include a memory controller 110 coupled to a plurality of memory devices 150-1 . . . 9. Although 9 memory devices are depicted, it should be understood that this is to aid in the description. The techniques described herein are not limited to any particular number of memory devices.

The memory controller 110 may be a device that is a standalone device, or it may be integrated within a larger device (e.g., a processor, part of a chipset). The techniques described herein are not limited to any particular implementation. The memory controller may include a data block compression circuit 115, an ECC generation circuit 120, and a memory device write circuit 125. The memory controller and each of these circuits may be implemented as hardware circuits, or as a combination of hardware circuits and instructions readable and executable by the hardware circuits. For example, the memory controller may be implemented as logic on an integrated circuit, as an application specific integrated circuit (ASIC), as an FPGA, or in any other suitable manner.

The data block compression circuit may be a circuit to receive a block of data and compress that block of data. For example, the compression circuit may implement Base Delta Immediate (BDI) compression, which may allow a 64 byte data block to be compressed to a data block ranging from 0 to 64 bytes. Although a specific compression technique has been mentioned, the techniques described herein are not limited to any specific compression mechanism.

A block that cannot be compressed may be stored in raw form. A block that can be compressed may have a compression header generated by the compression circuit 115. The compression header may contain information that may be used to later assist in decompression. For example, the compression may indicate the process that was used to compress the data block and how that data block can be decompressed.

The ECC generation circuit 120 may be circuitry used to calculate an ECC for the block of data. The ECC may be used to determine if there has been an error in the data. Many ECCs can be used to correct for single bit errors and detect multiple bit errors. In some implementations, as will be described in further detail below, the ECC may be used to determine if the data block has been compressed. In the example being described, there are 8 bytes provided for an ECC. If the ECC being used does not use all 8 bytes, one or more bits may be used to indicate that the data block is compressed. The ECC generation circuit may insert those bits into the ECC in such implementations. These bits may be referred to as compression metadata. However, if the ECC uses all 8 bytes, an alternate mechanism for determining if the data block is encrypted is described below, with respect to FIG. 3.

The memory device write circuit 125 may be used to write bytes of data to memory devices. For example, the memory device write circuit may be coupled to memory devices that make up a rank of memory. When it is desired to write a line of data to the rank of memory, the memory device write circuit may write the line to the individual memory devices that make up the rank.

The system 100 may also include a plurality of memory devices 150-1 . . . 9 that make up a memory rank. System 100 is shown with a memory rank made up of 9 devices. However, it should be understood that this is for purposes of ease of description and not by way of limitation. The techniques described herein are suitable for use with memory ranks comprising any number of memory devices.

Each memory device may store a particular range of bytes for a given line. For example, memory device 150-1 may store bytes 0-7 for each line, memory devise 150-2 may store bytes 8-15, and so on. The rank of memory may store any number of lines, as is shown by lines 1-n. The techniques described herein are not limited to ranks storing any particular number of lines. What should be understood is that a rank of memory may store many lines, and an individual memory device within the rank may store a portion of each line.

In operation, a request to write a block of data may be received by the memory controller. This is depicted by the "DATA BLOCK IN" arrow. At a high level, there are two possibilities when it comes to compressing a block of data. The block is either compressible or it is not compressible. Each of these two situations is now described.

Assume the received block of data 175 is not compressible. As such, the data block compression circuit is not able to compress the data block. As mentioned above, uncompressible data blocks are stored in their raw form. In this case, the block of data is 64 bytes long and may be store uncompressed. The ECC generation circuit may generate an ECC over the 64 bytes and the ECC is appended to the line. The memory device write may then receive the uncompressed data block as well as the appended ECC and write the line to memory devices 150-1 . . . 9. As indicated by the matching hashes, the block of data 175 is show as being written to line 1 within the memory devices. It should be noted that is such cases, each memory device is written to, and as such write energy is used for writing to all 9 memory devices.

In the second case, the received block of data 176 may be compressible. In the example, assume that the compression circuit 115 is able to compress the data block to a smaller number of bytes. The compression circuit may then append a compression header to the compressed bytes. The compression header may be described as metadata that describes the compression. As shown by the hashes on line 176, assume that the compressed data and compression header uses bytes 0-23 (24 bytes total). The ECC may then generate an ECC covering the 24 bytes of compression header and data plus 40 bytes of padding.

The memory device write circuit may then write the compressed line to the memory devices. As shown, memory devices 150-1-3 in line 3 of the memory devices may be used to store the compression header and compressed data. The generated ECC may be stored in memory device 150-9. However, it is not necessary to write any data to memory devices 150-4-8, as indicated by the blacked out boxes. In comparison to the uncompressed case described above, only 4 memory devices instead of 9 are written to. As mentioned above, each write to a memory device requires write energy. By reducing the total number of memory devices written to, compression enables a reduction in the total amount of write energy needed to write a line of data.

In addition to reducing the amount of write energy needed, the techniques described herein also provide for a mechanism to reduce the amount of read energy needed when reading a line of data. This technique is described in further detail below, but what should be understood for now is that the portions of the line not written (e.g. the portions in black) are not use to store valid data. In other words, the portions of each line in black remain unused.

Figure 2:
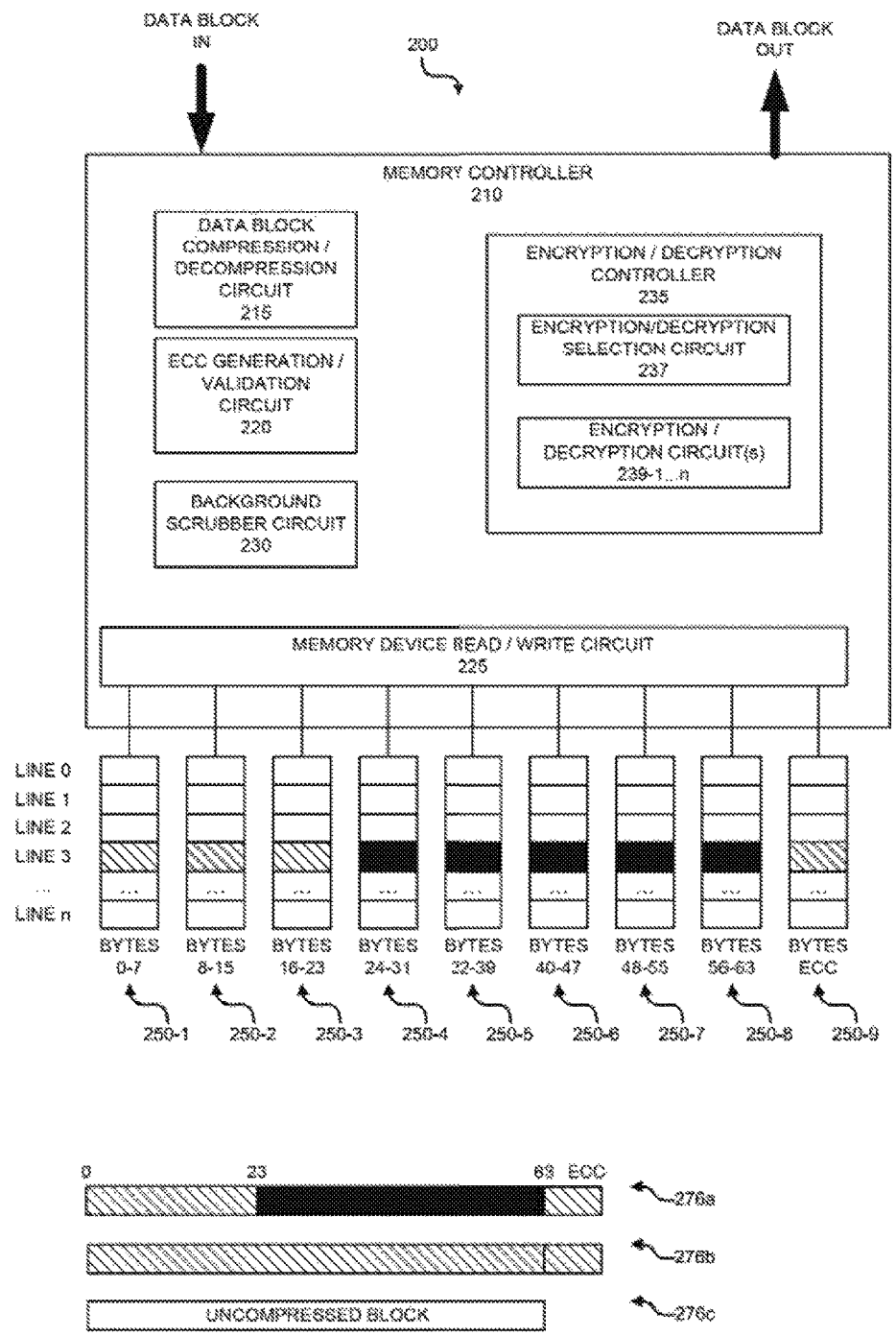
FIG. 2 depicts another example of a device that may use the data writing techniques described herein.

FIG. 2 depicts another example of a device that may use the data writing techniques described herein. Many of the elements of FIG. 2 are very similar to the elements in FIG. 1 and are similarly numbered. For ease of description, the description of those elements is not duplicated. System 200 may include a memory controller 220, which is very similar to memory controller 110. The memory controller may include a data block compression/decompression circuit 215, an ECC generation/validation circuit 220, a memory device write circuit 225, a background scrubber circuit 230, and an encryption/decryption controller 235. System 200 may also include memory devices 250-1 . . . 9, which are essentially the same as those described with respect to FIG. 1.

Data block compression/decompression circuit 215 performs a similar function to the similarly numbered element in FIG. 1. In addition, circuit 215 may also perform decompression. For example, the circuit may use the compression header contained in a compressed line and use that information in order to decompress the compressed line back into the uncompressed block. Although circuit 215 is depicted as a single circuit performing both compression and decompression, it should be understood that this is only an example implementation. Other implementations may use different circuit to perform these functions.

System 200 may also include ECC generation/validation circuit 220. As above with respect to element 120, circuit 220 may generate an ECC to ensure that a line does not contain errors. Circuit 220 may also include functionality to validate the ECC. Circuit 220 may examine a line of data and validate that the ECC indicates that there are no errors in the line. As above, although depicted as a single generate/validate circuit, this is only an example implementation. Other implementations may use different circuits for each of these functions.

System 200 may also include a memory device read/write circuit 225. The memory device read/write circuit may be very similar to the equivalent circuit in FIG. 1, with the exception that the memory devices can be both read and written. The description is not repeated here. System 200 may also include a background scrubber circuit 230. The background scrubber circuit may examine the memory devices 250-1, . . . 9 as a task that runs continuously in the background, setting unused portions of lines to a high resistance state. As mentioned above, some portions of lines may remain unused (e.g. the black boxes). For some memory technologies (e.g. memristor), the amount of read energy used is dependent on the values stored at the designated location, and in the same array. Reads and writes to arrays with more high resistance values may require less energy to perform the read or write. For memory devices storing unused portions of the line, setting the resistance value to a high state reduces the amount of energy needed when reading or writing the line.

Although additional write energy is used when setting the memory devices to the high resistance states, this energy can be expended at a time that is convenient for the system. For example, assume that over a period of time there are a large number of memory writes. During such periods, reducing the overall amount of write energy would be useful, as reduction of energy usage in a system may be helpful. For example, reduction in energy usage may allow the system to remain below power usage caps. Thus, omitting the writes to unused devices would be helpful in ensuring the system stays within operating parameters (e.g. total energy usage). However, at a later time, there may not be many writes occurring. During these periods of time, the background scrubber circuit may operate. If the system load increases such that the background scrubber's energy usage becomes problematic, the system can temporarily halt the background scrubber circuit.

System 200 may also include an encryption/decryption controller 235. The encryption decryption controller may include an encryption/decryption selection circuit 237 and at least one encryption/decryption circuit 239-1 . . . n. The encryption/decryption controller may be used to encrypt and decrypt lines that are stored to the memory devices. The encryption may help improve security in the system. For example, as mentioned above, NVRAM may retain its contents even when power is no longer supplied. A malicious actor could physically steal one or more of storage devices 250-1 . . . 9. The data on these devices could then be retrieved by the malicious actor. By encrypting the data, it may be ensured that even in such a situation, the stolen devices would remain unreadable.

The controller 235 may include an encryption/decryption selection circuit. The encryption/decryption selection circuit 237 may be responsible for dividing up a data block into smaller blocks of a fixed size. In some cases, the smaller blocks may be padded with a value, such as 0. The circuit 237 may be used to divide up the block and pad as needed. Operation of the circuit 237 is described in further detail below, with respect to FIG. 3(a-c).

The controller 235 may also include at least one encryption/decryption circuit 239-1 . . . n. The encryption/decryption circuit 239 may be used to encrypt/decrypt the fixed size blocks of data generated by the circuit 237. In some cases, there may be a single circuit, and blocks are encrypted/decrypted serially. In other implementations, there may be multiple circuits 239, and encryption/decryption of the fixed size blocks may occur in parallel. Furthermore, although shown as a combined encryption/decryption circuit, it should be understood that this functionality may be divided into separate encrypt and decrypt circuits. What should be understood is that system 200 provides circuits to both encrypt and decrypt fixed size blocks of data.

Operation of system 200 will be described with reference to several examples. Those examples will generally start with an uncompressed block of data, and will move through the process of compression, encryption, decryption, and decompression. However, every example, will not include every stage.

Continuing with example 176 from FIG. 1, assume that there is a compressed line 276a. The compressed line is also shown as line 3 in memory devices 250-1 . . . 9. In order to read the line, all 9 memory devices 250-1 . . . 9 may be read using the memory device read/write circuit. The data block compression/decompression circuit 215 may examine the compression metadata to determine if the line is compressed. For example, the bits taken from the ECC bytes above may be examined to determine if the block is compressed. If the line is not compressed, the ECC generation/validation circuit 220 may validate the line 276b by determining if the ECC indicates there are any errors. If no errors are present, the uncompressed line 276c may be sent out of the memory controller as indicated by the data block out arrow.

However, if it is determined that the line is compressed, the data block compression/decompression circuit 215 may examine the compression header metadata that was appended to the compressed line to determine how the line was compressed. The line may be padded based on the compression header and the ECC validated. If the line is valid the circuit 215 may decompress the line, resulting in an uncompressed line 276c. The uncompressed data block 276c may be sent as the data block out.

Figure 3A:
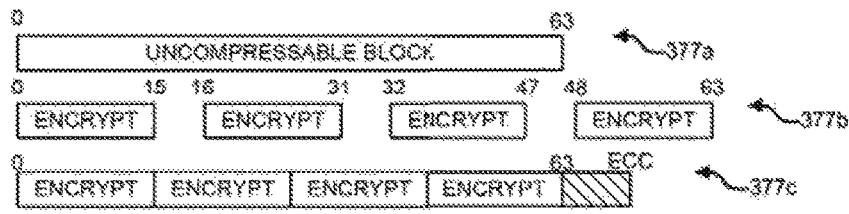
FIGS. 3(a-c) depict examples of write/read patterns in accordance with the data writing techniques described herein.

FIGS. 3(a-c) depict examples of write/read patterns in accordance with the data writing techniques described herein. FIGS. 3(a-c) continue with the examples that were started in FIGS. 1 and 2. FIG. 3a depicts the encryption process. For example, assume that an uncompressible block of data 377a is received. As should be understood, not all data blocks are able to be compressed. The case of a compressible data block is described further below. The encryption/decryption controller 235 may be used to encrypt the data block.

The encryption/decryption selection circuit 237 may divide the data block 377a into fixed size units. For example, the fixed size units may be 16 bytes each, resulting in the 64 byte data block being divided into 4 fixed size encryption blocks. The encryption/decryption circuit(s) 239-1 . . . n may then encrypt each of the fixed size blocks 377b. As mentioned above, if multiple encryption circuits are provided, the encryption of each block may occur in parallel. However, the techniques described herein are also suitable for use with a single encryption circuit, wherein the blocks are serially encrypted.

The ECC generation/validation circuit 220 may then generate an ECC to ensure that the line contains no errors. The ECC may be appended to the line 377c and the line stored in the memory devices. As indicated, because no compression was done, all memory devices are written and there is no saving of write energy. The process of decrypting the line is described in further detail below.

Figure 3B:
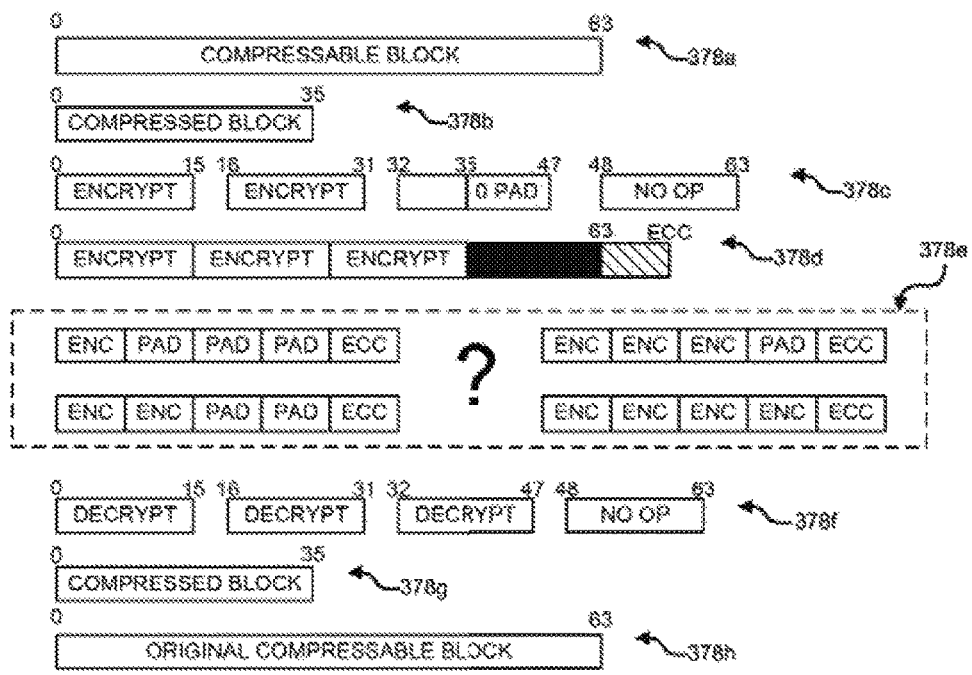

FIG. 3b depicts an example of receiving a compressible block of data, compressing the block, encrypting the block, decrypting the block, decompressing the block, and returning the original compressible block. As shown, a compressible block of data 378a may be received. The data block compression/decompression circuit 215 may be used to compress the data block and append a compression header 378b. In this example, the compressed data block and header is shown as being 36 bytes long.

The encryption/decryption selection circuit 237 may then divide the compressed block into fixed sized encryption units 378c. For example, the fixed size encryption units may be 16 bytes long. As shown, the compressed block may be divided into a first complete encrypt block for bytes 0-15 and a second complete encrypt block for bytes 16-31. The remaining bytes, 32-35 may then be padded (e.g. padded with zeroes) to result in a third encrypt block spanning bytes 32-47. It should be noted that no data is being stored in bytes 48-63. Blocks may then be encrypted by the encryption/decryption circuits 239-1 . . . n. It should be noted that the energy used in the encryption process may be reduced because the total number of blocks to be encrypted has been reduced. For example, unlike the case above with the uncompressible block where 4 blocks were encrypted, here, only 3 blocks are encrypted. Thus the energy used by the encryption blocks may be saved.

The ECC generation/validation circuit 220 may then generate an ECC to protect the line. For example, a 16 byte block of zeroes may be appended to the 3 encrypted blocks. An ECC may be generated and appended to the line 378d. The line may then be written to the memory devices by the memory device read/write circuit 225.

When encryption is performed, the mechanism for decrypting and decompressing the data is slightly different than that which was described above. For example, previously, some spare bits in the ECC bytes may have been used to identify if the block was compressed or not. If it was compressed, the compression header could be examined. However, this examination does not work in cases where the line is encrypted, because the compression header would be unreadable (e.g. it is encrypted). In other words, even if there were bits available in the ECC bytes to indicate the line was encrypted, the compression header could not be deciphered to determine how to decrypt the block. In addition, in some cases, the ECC may use all the available bytes and no spare bits may be available to determine it the line is encrypted.

In the current example, where a line is 64 bytes long, and the encryption block fixed size is 16 bytes, a compressed line may result in either 1, 2, 3 or 4 encrypted blocks. An uncompressed line results in 4 encrypted blocks. As mentioned above, an ECC is generated for the line, padding with zeroes as needed. The ECC generation/validation circuit 220 may attempt to validate the line under each of the four possible scenarios. As shown in 378*e*, the four possibilities may be 1) one encrypted block, three pad blocks 2) two encrypted blocks, two pad blocks, 3) three encrypted block, one pad block, and 4) four encrypted blocks. With selection of the right ECC it is highly unlikely that more than one of the four possibilities described above would be properly validated by the ECC. Thus, of the four possibilities, the one that is successfully validated determines how many encrypted blocks are present.

After the validation, the encryption/decryption selection circuit 237 may be made aware of how many encrypted blocks are in the line. The selection circuit may then cause the decryption circuits 239-1 . . . *n* to decrypt the determined number of encrypted blocks. Just as above in the encryption process, because a reduced number of decryptions may need to be performed, the energy used in decrypting may be reduced.

The encrypt/decrypt circuits 239-1 . . . *n* may then be used to decrypt the number of blocks 378*f* determined by the selection circuit 237. Once the decryption is complete, the compressed block 378*g* is recovered. At this point, the compression header is no longer encrypted, and can be retrieved from the compressed block. The data block compression/decompression circuit 215 may then be used to decompress the compressed block back to the original compressible block 378*h*. This step further confirms the size of the block estimated by the ECC validation circuitry.

Figure 3C:
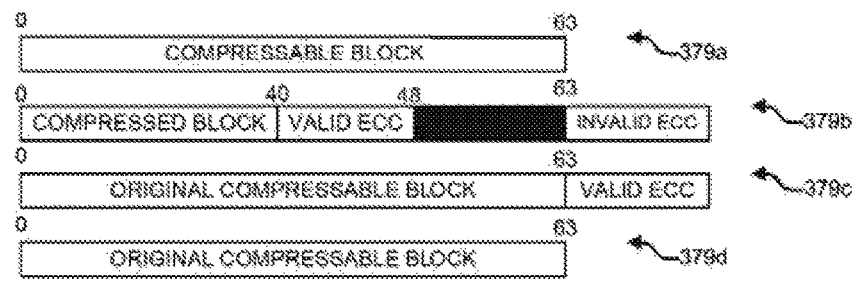

FIG. 3*c* describes an alternative mechanism to determine if a block has been compressed. As mentioned above, some ECCs may utilize all available space, leaving no bits available to indicate if a block is compressed or not. An alternative mechanism for determining the compression status of a data block may make use of an invalid ECC. Just as above, a compressible block 379*a* may be received. The compressive block may be compressed. For example, as shown, the compressed block (including compression header) may reside in bytes 0-40. A valid ECC covering those 40 bytes may then be generated and appended to the compressed block.

The valid ECC may be generated by either padding out the compressed block to the size needed by the ECC generation circuit 220. For example, if the ECC generation circuit expects a 64 byte block, then the compressed block can be padded with zeroes. In the alternative, an ECC that does not depend on a specific block size may be generated and data regarding the generation placed in the compression header.

An invalid ECC may then be generated. The invalid ECC may be guaranteed to fail. The compressed block (e.g. bytes 0-40), the valid ECC (e.g. bytes 41-48), unused devices (e.g. bytes 49-63), and the invalid ECC may be stored as a line 379*b*, in cases where some compression was possible. In cases where no compression is possible, the ECC generated would be the valid ECC to cover the full data block.

When attempting to retrieve the data block, the line containing the data is first read from all memory devices in the rank. The ECC validation circuit 220 attempts to validate the line. If the validation is successful, it means the line was uncompressed, and the data block can be sent out. However, if the ECC validation fails, it may mean that the line is compressed. The compression header may then be examined (perhaps after decryption) to determine how the line was compressed, where the valid ECC is located within the line, and how that ECC was generated 379*c*. The block may then be decompressed and validated using the valid ECC. The original uncompressed block may then be sent out.

Figure 4:
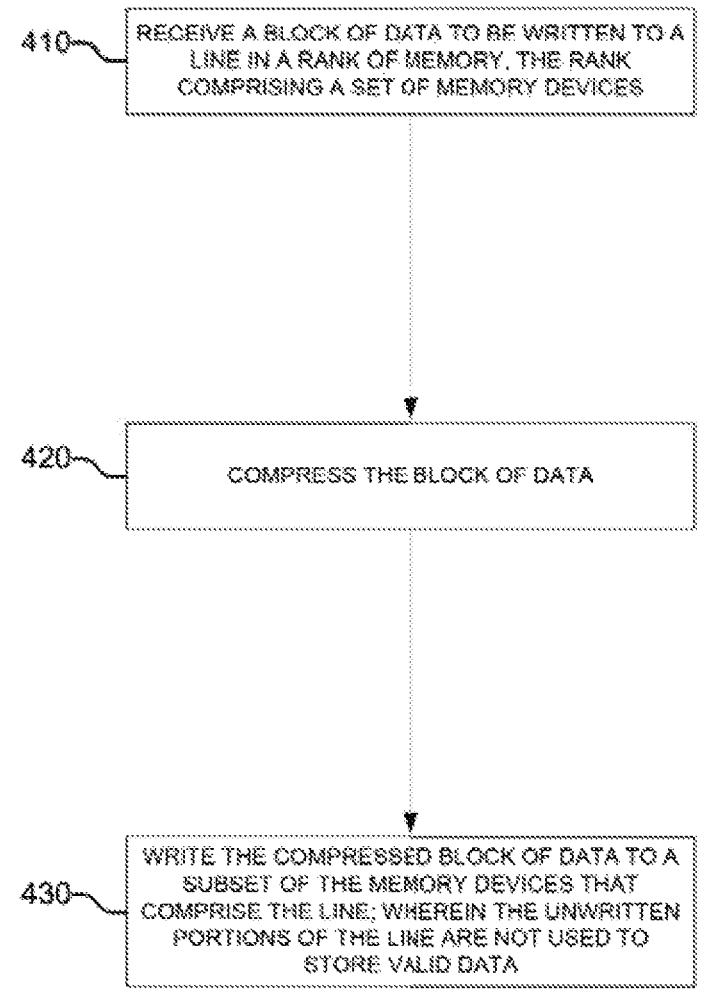
FIG. 4 depicts an example high level flow diagram of the data writing techniques described herein.

FIG. 4 depicts an example high level flow diagram of the data writing techniques described herein. In block 410, a block of data to be written to a line in a rank of memory may be received. The rank of memory may comprise a set of memory devices. As described above, the rank may be made up of any number of memory devices. The techniques described herein are not limited to a specific number of memory devices within a rank.

In block 420, the block of data may be compressed. As explained above, one possible compression mechanism is BDI compression. However, techniques described herein are not dependent on any particular compression mechanism. In block 430, the compressed block of data may be written to a subset of memory devices that comprise the line. The unwritten portions of the line are not used to store valid data. By writing the compressed block of data to a subset of memory devices, the total amount of write energy is reduced. Furthermore, by ensuring that the unwritten portions of the line are not used, there is no reason for the OS to be made aware of the compression. As far as the OS is concerned, each line stores one line sized block of data. The OS does not need to consider the possibility that a single line may hold data from two separate original blocks of data.

Figure 5A:
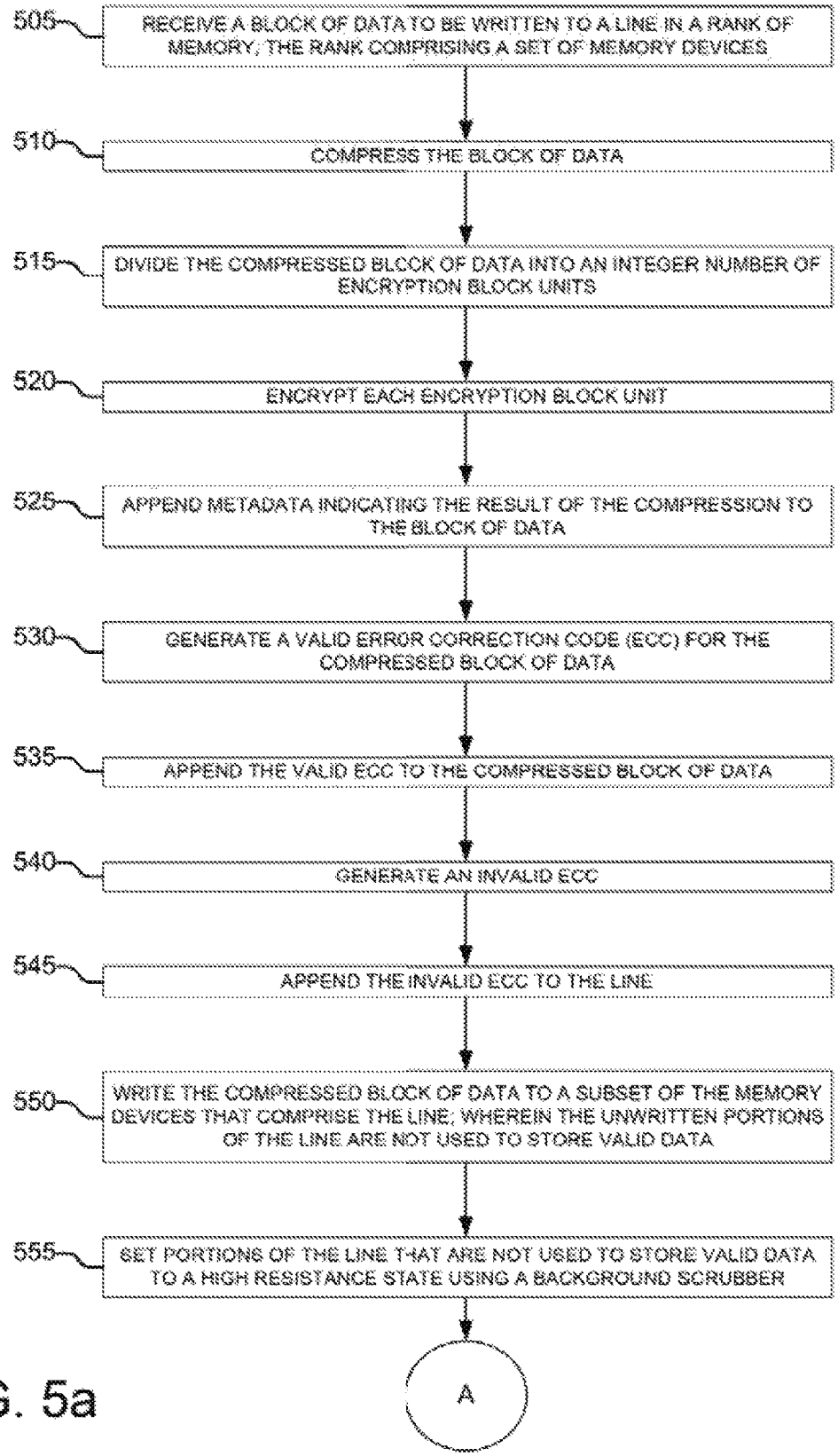
FIG. 5(a,b) depicts another example high level flow diagram of the data writing techniques described herein.
Figure 5B:
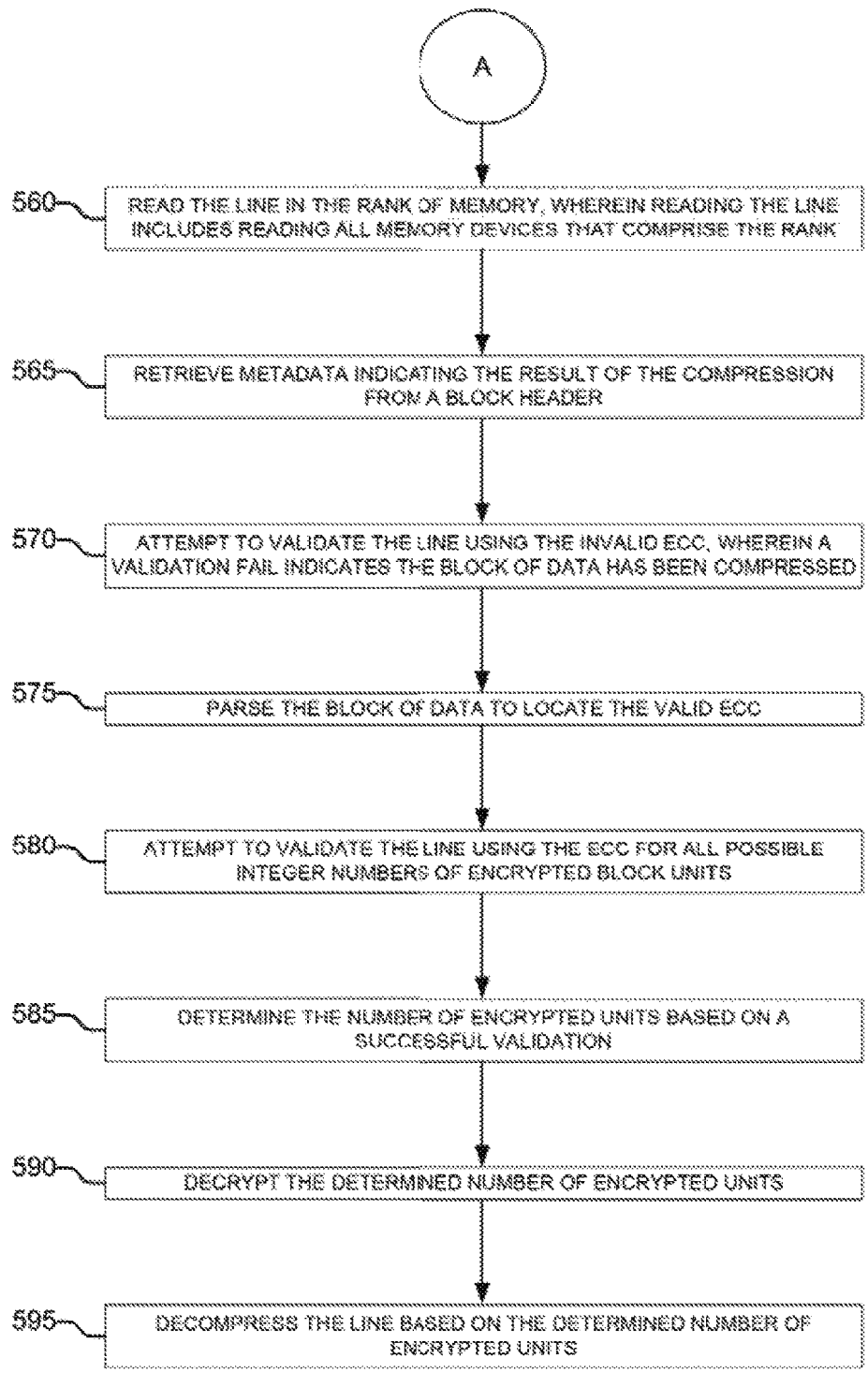

FIG. 5(*a,b*) depicts another example high level flow diagram of the data writing techniques described herein. In block 505, just as above in block 410, a block of data to be written may be received. In block 510, just as in block 420, the block of data may be compressed. In block 515, the compressed block of data may be divided into an integer number of encryption block units. As explained above, the encryption circuit may operate on a fixed size block. Thus, the compressed block may be divided in accordance with the fixed size block. As previously mentioned, blocks may be padded if necessary to arrive at the fixed encryption block size.

In block 520, each encryption block unit may be encrypted. The techniques described herein are not limited to any particular type of encryption. Any encryption mechanism is suitable for use with the techniques described herein. In block 525, metadata indicating the result of the compression may be appended to the block of data. This metadata may include the compression header or may include using spare bits within the ECC to indicate if the block is compressed. As explained above, the particular type of metadata used is dependent on if extra bits are available and if encryption is being used.

In block 530, a valid ECC may be generated for the compressed block of data. As mentioned above, the valid ECC may be used to verify a compressed line. In block 535, the valid ECC may be appended to the compressed block of data. In block 540, an invalid ECC may be generated. In block 545, the invalid ECC may be appended to the line. As mentioned above, if the ECC validation of the line fails, this may indicate that the line has been compressed.

In block 550, the compressed block of data may be written to a subset of the memory devices that comprise the line. The unwritten portions of the line may not be used to store valid data. In block 555, portions of the line that are not used to store valid data may be set to a high resistance state using a background scrubber. As described above, setting unused portions of a line to a high resistance state may reduce the amount or energy used during a read or write of the memory devices.

In block 560, a line in a rank of memory may be read. Reading the line may include reading all memory devices that comprise the rank. In other words, all memory devices, even those which may not be storing valid data for the line are read. In block 565, metadata indicating the result of the compression may be retrieved from a block header. As mentioned above, in the case of an unencrypted line, the compression header is readily available.

In block 570, an attempt to validate the line using the invalid ECC may be made. A validation fail may indicate that the block of data has been compressed. In block 575, the block of data may be parsed to locate the valid ECC. As mentioned above, the validation failure with the invalid ECC may indicate a compressed block. The location of the valid ECC may be determined by parsing the compression header to determine where the valid ECC is and how the block was compressed.

In block 580, the line may be validated using the ECC for all possible integer numbers of encrypted units. As described above, in the case of an encrypted line, there may be a limited number of possible encrypted blocks (e.g. 1, 2, 3, or 4). The validation attempts may be made on each of these limited possibilities, and a successful validation may indicate how many encrypted blocks are present. It should be understood that the above description is based on the 16 byte per encryption unit granularity. In some implementations, the determining granularity is the compression granularity. For example, the ECC check could be performed assuming one device, two devices, and so on, up to the maximum number of devices. The ECC check that succeeds may determine how compressed the block is. In block 585 the number of encrypted units may be determined based on the successful validation.

In block 590, the determined number of encrypted units may be decrypted. As described above, by only decrypting the number of encrypted units present, the energy used for decryption may be reduced. In block 595, the line may be decompressed based on the determined number of encrypted units.

Figure 6:
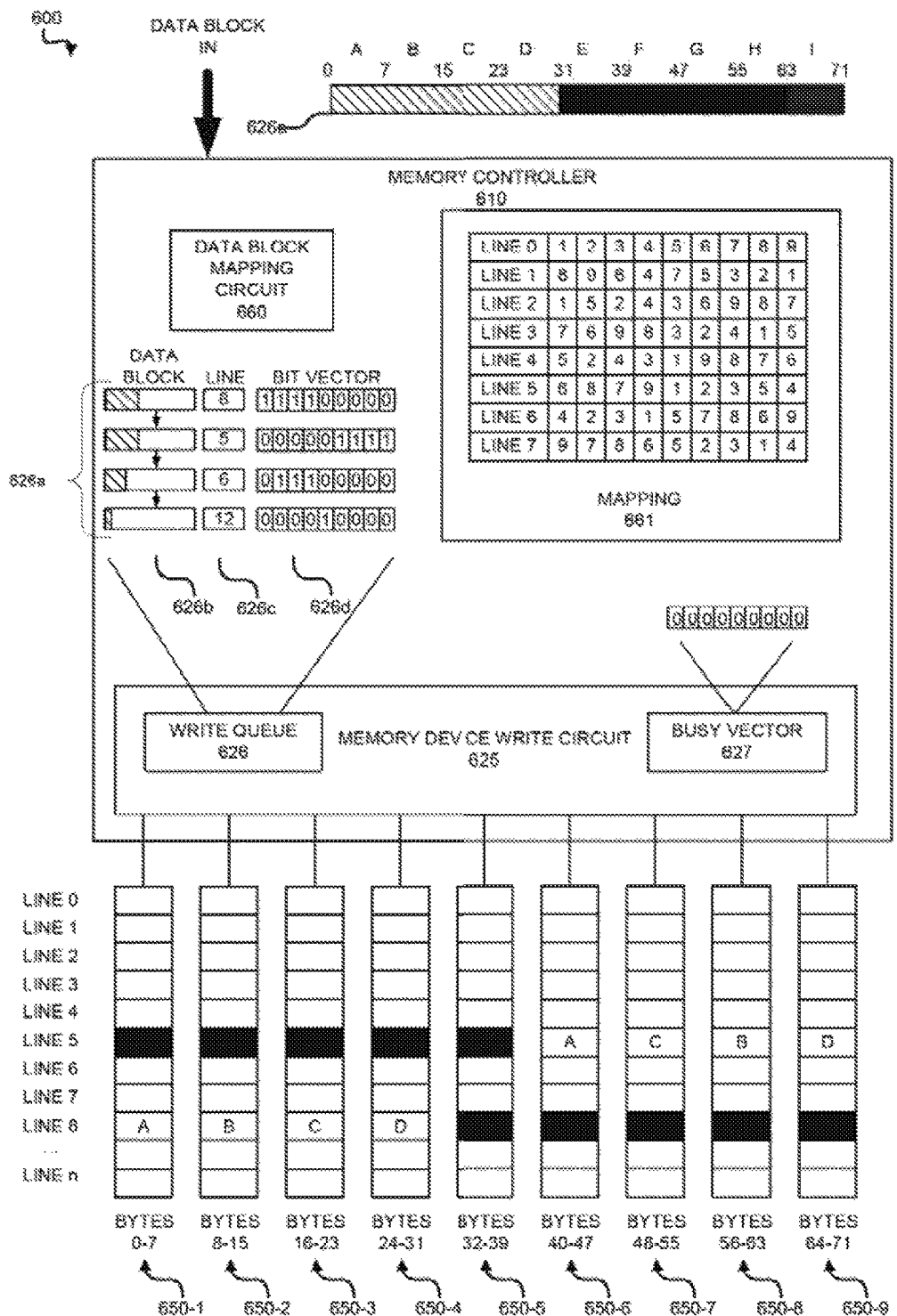
FIG. 6 depicts an example system including write based on mapping, according to the techniques described herein.

FIG. 6 depicts an example system including write based on mapping according to the techniques described herein. System 600 may include all of the components previously described with respect to FIGS. 1 and 2, however those components are not shown for purposes of clarity. System 600 depicts mainly those components used for writes based on mapping. However, it should be understood that system 600 contains all the functionality previously described.

System 600 may include a memory controller 610. The memory controller may include a data block mapping circuit 660, a memory device write circuit 625, and memory devices 650-1 . . . 9.

The data block mapping circuit 660 may include the functionality used to provide the write based on mapping techniques described herein. The data block mapping circuit may include a mapping 661. The mapping may determine how a data block is written to the various memory devices. In one example implementation, the mapping may be an array. Each line of the array may be considered the mapping to be used for that line. For example, as shown, the mapping for lines 0 through 7 is shown. In some example implementations, the mapping may be selected to minimize the memory device overlap of any two adjacent lines. For this purpose, the first and last line may be considered adjacent. Minimizing the overlap may be helpful in increasing the probability that multiple lines may be written in parallel, as will be described below.

A mapping may be selected based on the line being written. For example, the line number being written may be divided (mod) by the total lines shown in the mapping (e.g. 8). The remainder may determine the selected mapping. For example, if line 8 is being written, the remainder will be 0, thus the mapping for line 0 is selected. Likewise, if line 13 is being written, the remainder will be 5, then the mapping for line 5 may be selected.

Once a mapping for the line is selected, the memory devices used for that line can be determined. As shown, the 9 boxes to the right of each line indicate the memory devices that are to be used to write that line, as well as the order in which those memory devices are to be written. It should be noted that order does not imply sequential writes of memory devices. In fact, the devices may be written in parallel. For purposes of this description the write order indicates how bytes of the line are mapped to the memory devices (e.g. first 8 bytes on device x, second 8 bytes on device y, etc.). Thus, when writing a line, the particular memory device used may be dependent both on the line being written as well as the size of that line. Operation of the mapping is described in further detail with respect to an example below.

The memory device write circuit 625 includes all of the functionality of the memory device write circuit described above. In addition, the circuit may include a write queue 626 and a busy vector 627. The write queue may be a queue that holds lines that are waiting to be written to the memory devices. An example portion of a write queue 626a is shown. Each entry in the write queue may include the data block (e.g. the compressed block) 626b, the line number to be written 626c, and a bit vector 626d. As will be explained in further detail below, the bit vector may be used to indicate which memory devices will be used to write a particular block of data as well as being used to determine which writes may occur in parallel.

The circuit 625 may also include a busy vector 627. The busy vector may indicate which memory devices, or more specifically the communications channel to the memory devices that are currently involved in a write transaction. For example, the busy vector may have one bit that represents each memory device. A set bit may indicate the memory device (e.g. the communications channel to the memory device) is currently busy, while a clear bit may indicate the device is currently not busy. As will be explained below, the busy vector may be used to determine when writes may proceed concurrently.

The system 600 may also include memory devices 650-1 . . . 9. These memory devices are generally the same as those depicted in FIGS. 1 and 2, although more lines are shown.

In operation, data blocks may be received by the memory controller. Just as above, those data bocks may be compressed. The compressed data blocks may then be placed in write queue 626. As shown, the data blocks 626b contain a hashed portion, which indicates data to be written and a clear portion, which may indicate data that need not be written (e.g. unused space resulting from the compression). Line 626e shows a line in more detail. For example, as shown, bytes 0-31 may include valid data to be written, while bytes 24-71, shown in black, may not need to be written.

In the example implementation shown in FIG. 6, each memory device may store 8 bytes of a line. As such, the line 626e is divided into 8 byte segments, labeled A-I. These labels will now be used to describe how the mapping may be used to write a line to the memory devices in memory.

For example, assume that the line 626e is to be written to line 8. As explained above, the line number (i.e. line memory address) may be divided (mod) by the number of entries in the mapping table (e.g. 8) and the remainder used to determine which line in the mapping to select. In this case, line 8 divided by 8 has a remainder of zero, and as such the line 0 mapping may be selected. Referring to the line 0 mapping, it is shown that the memory devices are used in order (e.g.

1-9). In this example, the line 626*e* contains valid data to be written for bytes 0-31, corresponding to labels A-D. Thus, the first memory device may be used to write bytes 0-7 (e.g. A), the second device used to write byte 8-15 (e.g. B), the third device used to write bytes 16-23 (e.g. C) and the fourth device used to write bytes 24-31 (e.g. D).

As shown in the write queue, the memory devices that would be used for the write are shown in the bit vector 626*d*. As shown, the first 4 bits are set, indicating the first four devices will be used. As shown in line 8 in the memory devices, the blocks A-D are written to the first four memory devices in order. The process of writing the blocks is described in further detail with respect to FIG. 7.

As another example, assume line 626*e* is to be written to line 5 (or to a line which results in a remainder of 5). As such, the line 5 mapping will be used. The mapping shown for line 5 indicates that block A goes on device 6, block B on device 8, block c on device 7, and block D on device 9. Just as above, the busy vector is set to indicate that memory devices 6-9 are used for the write. It should be noted that the memory devices used for writing the same data block 626*e* are different, depending on which line in the memory device is being used. In addition to the lines described above, two additional lines (e.g. 6 and 12) are shown. As shown, these lines will use memory devices indicated by their bit vectors. The use of the bit vectors and the busy vector 627 is described in further detail with respect to FIG. 7.

FIGS. 7(*a-d*) depict examples of using bit vectors and a busy vector to permit concurrent writes according to techniques described herein. As described above, the bit vector may indicate for each entry in the write queue which memory devices (e.g. the communications channels for those memory devices) are going to be used to perform that write. If two different writes will use completely different memory devices, with no overlap, the two (or more) writes may proceed in parallel, because the communications channels to those devices would also contain no overlap. This is because although a memory device may not write two independent lines (e.g. portions of the line stored on that device) simultaneously, there is no need for independent memory devices to all write the same line. Thus, if one memory device is writing line 0, a different memory device could write line 5, because each device would be receiving commands over a different communication channel.

Figure 7A:
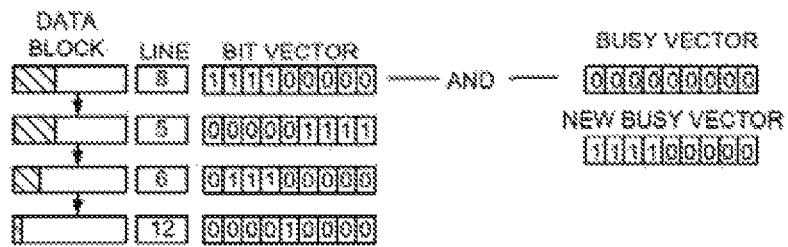
FIGS. 7(a-d) depict examples of using bit vectors and a busy vector to permit concurrent writes according to techniques described herein.

FIG. 7*a* depicts a write queue containing several lines to be written to the memory devices. The write queue is similar to that described with respect to FIG. 6. For purposes of this description, assume that at the outset, no writes are currently in progress (e.g. busy vector is completely clear). As shown in FIG. 7*a*, the first line in the write queue has the bit vector marked to indicate memory devices 1-4 are to be used. The system may first perform a bitwise AND with the busy vector. If the result is a zero, that means that the bit vector and the busy vector nave no common bits set. What this means is that the memory devices used in the busy vector are not the same as those that will be used according to the busy vector.

In the present example, the busy vector is initially empty. As such, the AND operation produces a zero result, indicating that the write may proceed. To update the busy vector to indicate which memory devices are in use, a bitwise OR operation may be performed between the busy vector and the bit vector. The result may then be stored in the busy vector. The end result being that the bits in the busy vector that were previously set, remain set, and those memory devices that will become busy with the new write will now have the corresponding bits set.

Figure 7B:
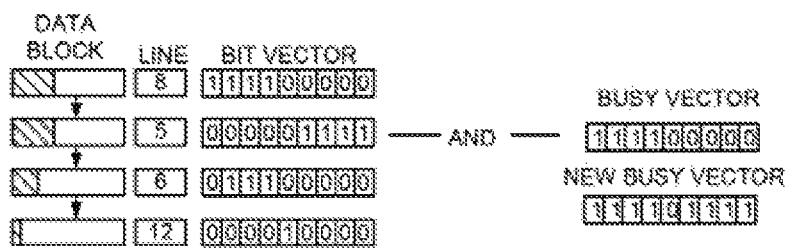

FIG. 7*b* depicts an attempt to write the second data block in the write queue. As shown, the bit vector for the second item in the write queue indicates that the last four memory devices (e.g. 6-9) are to be used for the write. Again, a bitwise AND between the bit vector and the busy vector is performed. Because there is no overlap of busy devices, the resultant value is zero, indicating that the two writes may proceed concurrently. The busy vector may then be updated by performing a bitwise OR between the current busy vector and the bit vector of the newly added write.

Figure 7C:
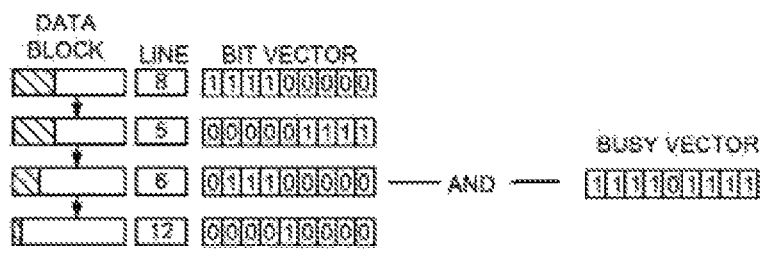

FIG. 7*c* depicts an attempt to write the third data block in the write queue. As shown, the bit vector for the third items indicates that three memory devices (e.g. 2-4) are to be used for the write. However, a bitwise AND of the bit vector with the busy vector results in a non-zero value (e.g. 011100000 AND 111101111=011100000). Because the same memory devices would be needed for both writes, the write of line 6 cannot occur concurrently. As such, the item remains in the write queue, and the next element is checked.

Figure 7D:
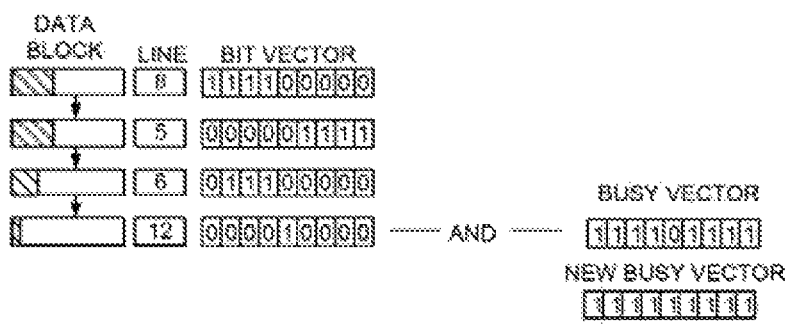

FIG. 7*d* depicts an attempt to write the fourth data block in the write queue. As shown, the fourth data block may use 1 memory device (e.g. device 5). Performing a bitwise AND between the bit vector and the busy vector results in a zero value. As mentioned above, a zero value indicates the writes may proceed concurrently. The busy vector may be updated by performing a bitwise OR. It should be noted that all bits in the busy vector are now set, indicating the communications channel to all memory devices are currently busy with a write. Thus, no new write of a line may be added, as all memory devices (e.g. the communications channel to each device) are busy. When the write issues, the bits associated with the memory devices may be cleared. At that point, new writes may proceed.

Although not shown in the figures described herein, it should be understood that when reading a line from the memory devices, the mapping described above is first reversed to put the line back into the original order. Then, the processing described with respect to FIGS. 1-5 may occur. In the context of the present example system, when a line is read, all nine devices may be read. Then it may be determined which mapping was used based on the address of the line. The mapping may then be reversed to recover the original line. The steps of determining the encryption/compression may then proceed as described above.

Figure 8:
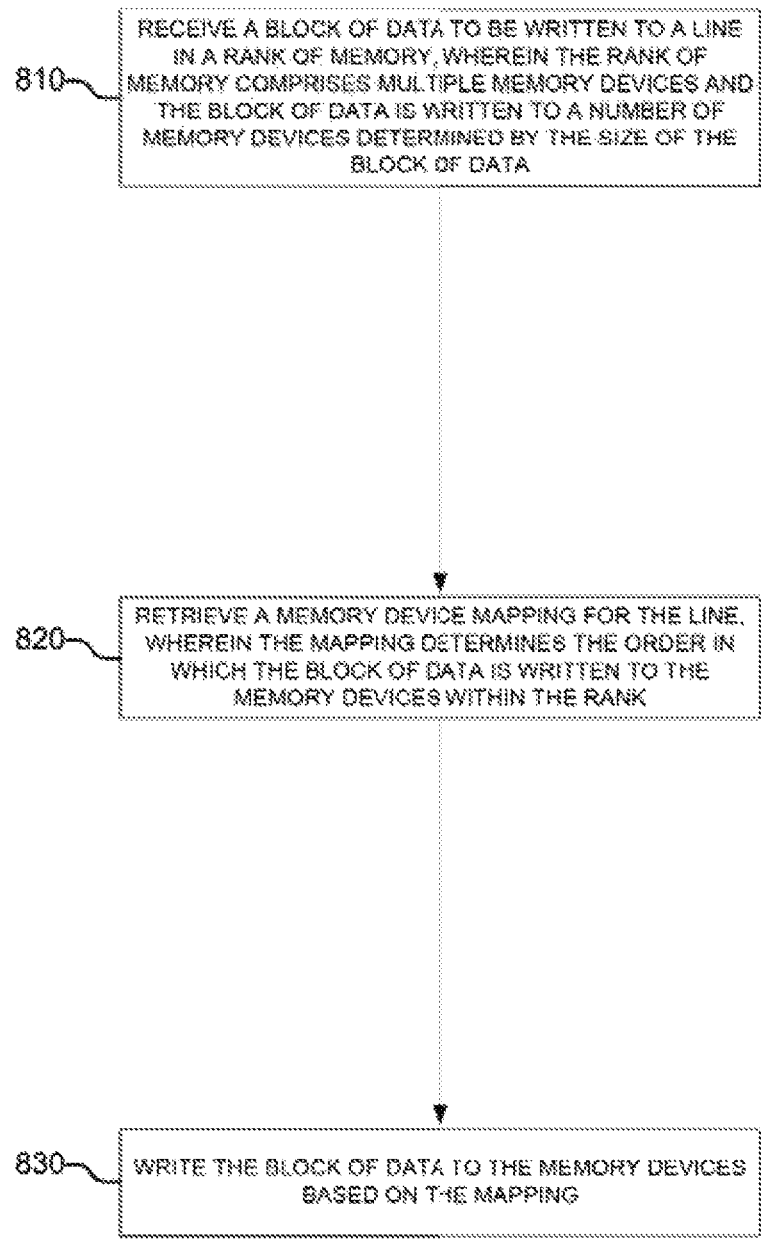
FIG. 8 is an example high level flow diagram for writing data according to a mapping according to techniques described herein.

FIG. 8 is an example high level flow diagram for writing data according to a mapping according to techniques described herein. In block 810, a block of data to be written to a line in a rank of memory may be received. The rank of memory may comprise multiple memory devices and the block of data may be written to a number of the memory devices determined by the size of the block of data. In other words, a block of data to be written to the memory devices may be received. The number of memory devices needed in order to write the complete block of data is determined by the size of the block of data. Smaller blocks may require fewer memory devices, while larger blocks may require more memory devices.

In block 820, a memory device mapping for the line may be retrieved. The memory device mapping may determine the order in which the block of data is written to the memory devices within the rank. In other words, the memory device mapping determines which memory devices will be used to write a block of data to the memory devices. In addition, the mapping determines the order in which the data block is written. As described above, the block of data is not necessarily written to memory devices in sequential order. Instead, the mapping may control the order of writes. In block 830, the block of data may be written to the memory devices. The write of the block of data to the memory devices may be based on the mapping.

Figure 9:
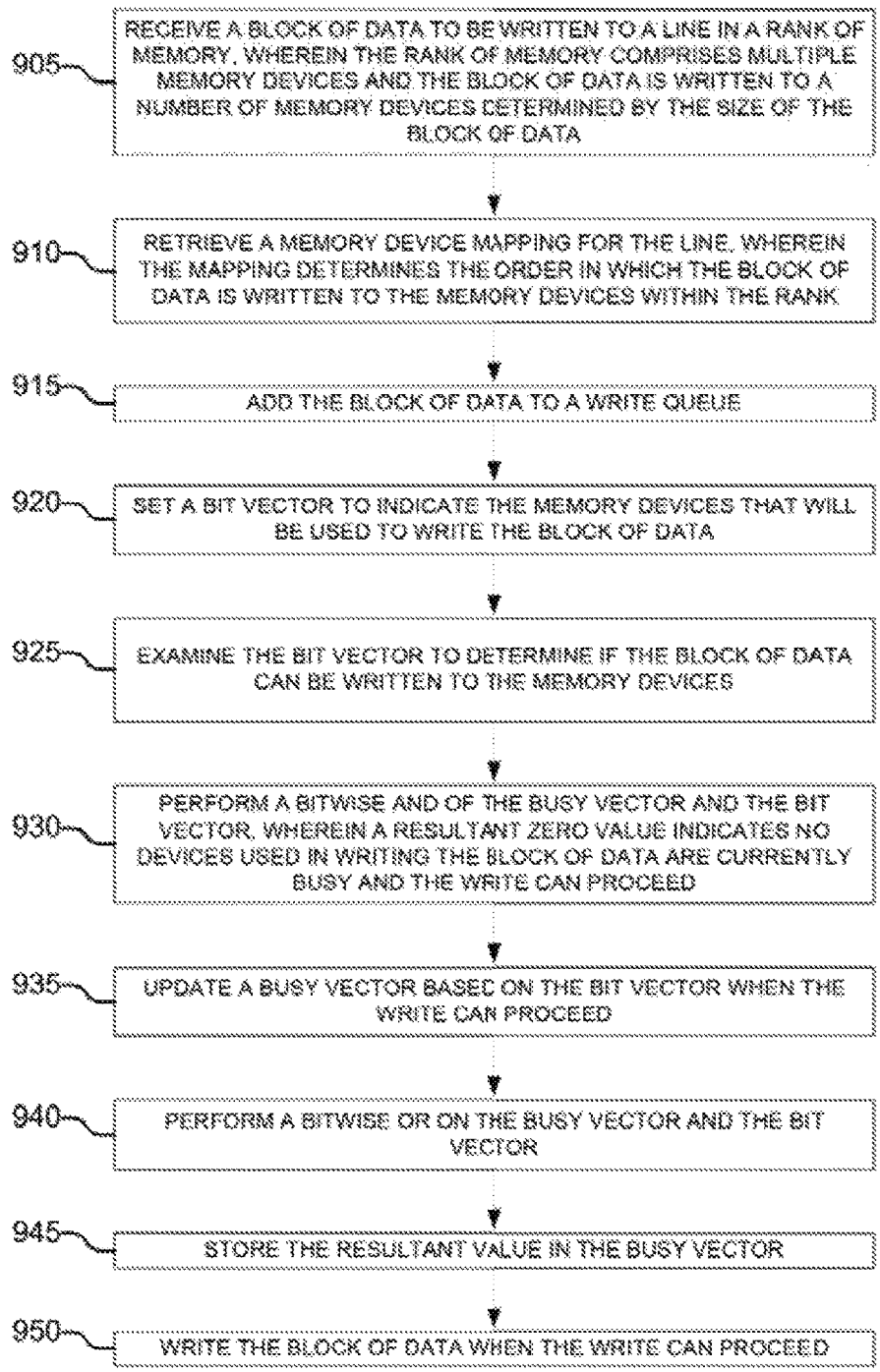
FIG. 9 is another example high level flow diagram to writing data according to a mapping according to techniques described herein.

FIG. 9 is another example high level flow diagram for writing data according to a mapping according to techniques described herein. In block 905, just as in block 810, a block of data to be written to a line in a rank of memory may be received. The number of memory devices needed to write the line varies based on the size of the block of data. In block 910, just as in block 820, a memory device mapping may be retrieved. The mapping may determine which devices, and in which order, the block of data is written to the memory devices.

In block 915, the block of data may be written to a write queue. The write queue may hold blocks of data that are waiting to be written to a line in a rank of memory devices. The write queue may hold the data blocks until the memory device write circuit is ready to write the line. In block 920, a bit vector may be set to indicate the memory devices that will be used to write the block of data. As mentioned above, the techniques described herein allow for fewer than the total number of memory devices to be used when writing a line of data to the memory devices. The bit vector may be used to identify which memory devices will be used when writing a specific block of data.

In block 925, the bit vector may be examined to determine if the block of data can be written to the memory devices. For example, if none of the memory devices that are specified in the bit vector are currently being written to, the write may proceed. Block 930 describes a technique to determine if the write can proceed. In block 930 a bitwise AND of the busy vector and the bit vector may be performed. A resultant zero value may indicate that no devices used in writing the block of data are currently busy, and the write can proceed. In other words, the busy vector maintains a record of which memory devices are currently involved in a write operation. The record is maintained as a busy bit vector. A bitwise AND of the bit vector and busy vector can only be zero when there is no overlap of set bits in each of those two vectors. No overlap indicates that the set of memory devices for each vector are different.

In block 935, the busy vector may be updated based on the bit vector when the write can proceed. If it is determined that a write can proceed, the busy vector is updated to reflect the memory devices that will be used for the write. These memory devices would then be considered busy for later comparison. Block 940 describes a mechanism for updating the busy vector. In block 940, a bitwise OR may be performed on the busy vector and the bit vector. In other words, the current busy vector is bitwise OR'ed with the bit vector of the line to be written. In block 945, the resultant values may be stored in the busy vector. The resultant value may be stored as the new busy vector. The bitwise OR operation ensures that the bits will be set for each memory device currently in use, or will be in use when the new block of data is written. Thus the new busy vector is set to indicate all memory devices that would be in use.

In block 950, the block of data may be written when the write can proceed. If the comparisons above indicate that there is no conflict between a new write and any write currently in progress, the new write may proceed. As mentioned above, bandwidth may be increased as multiple writes may occur in parallel.

Figure 10:
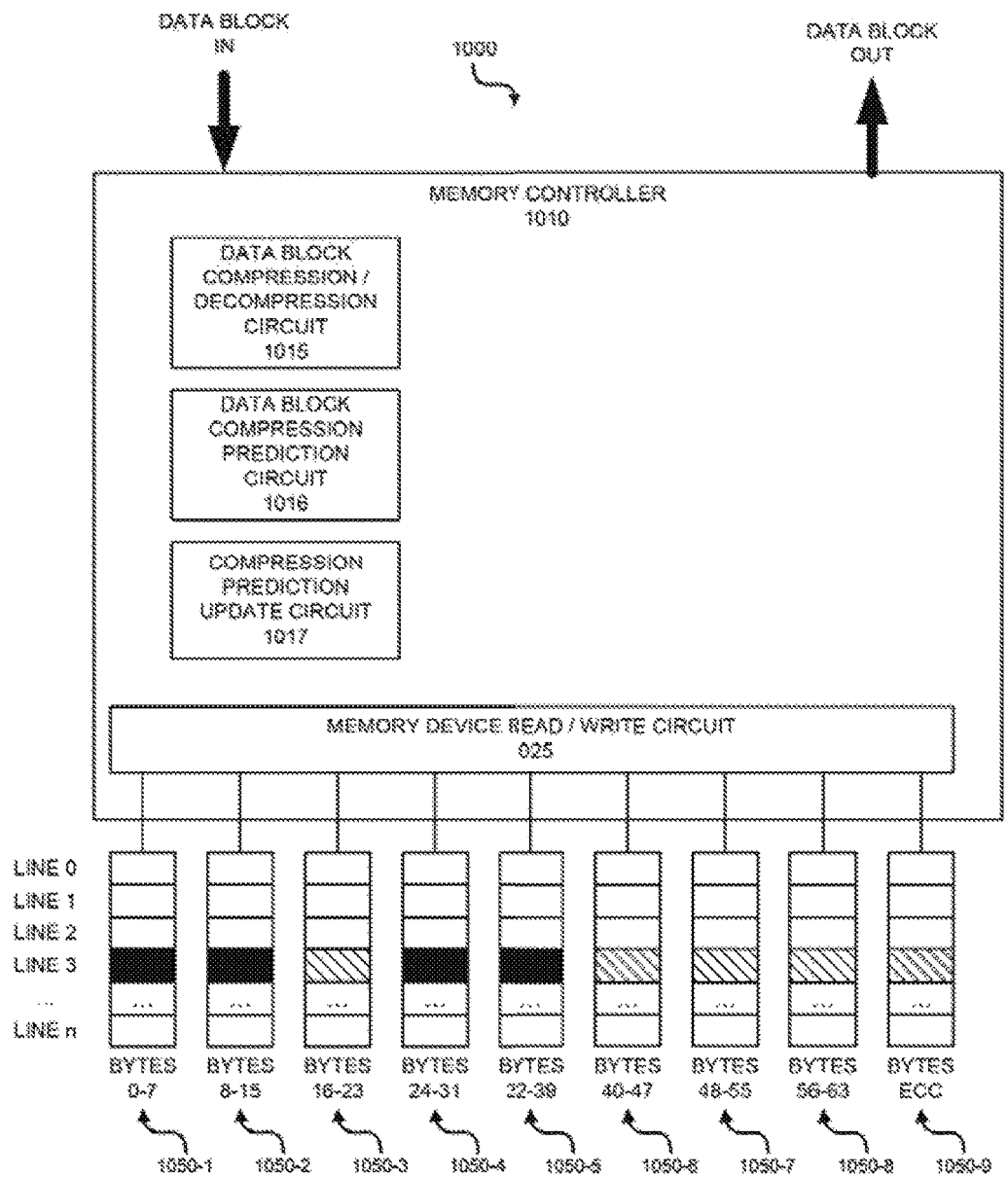
FIG. 10 depicts an example system including retrieve data blocks from determined devices techniques described herein.

FIG. 10 depicts an example system including retrieve data blocks from determined devices techniques described herein. System 1000 may include all of the components described in the previous figures, however, those compo-nents are not shown for the purposes of clarity. System 1000 depicts mainly those components used for retrieving data blocks from determined devices. It should be understood that system 1000 contains all of the functionality previously described.

System 1000 may include memory controller 1010. The memory controller may include a data block compression/decompression circuit 1015, a data block compression prediction circuit 1016, and a compression prediction update circuit 1017. Memory controller circuit may also include memory device read/write circuit 1025. In addition, system 1000 may also include memory devices 1050-(1 . . . 9). The description below assumes that all memory devices and all tanks within those memory devices make use of the prediction techniques described herein. However, the techniques are not so limited. For example, the prediction techniques may be applied to a subset of memory devices, a subset of ranks, and/or a subset of ranges of memory addresses, as well as any other possible combination. It should be understood that the techniques do not need to be implemented in an all or nothing manner.

The data block compression/decompression circuit 1015 provides functionality that has been described above, with respect to similarly numbered element 215. For purposes of clarity, the description of that functionality is not repeated here. Likewise, the memory device read/write circuit and the memory devices themselves have been previously described and those descriptions are also not repeated here.

The data block compression prediction circuit 1016 may be used when a request to retrieve a block of data is received by the memory controller 1010. The prediction circuit may predict the specific memory devices that were used to store the line corresponding to the blocks of data. As described above, the number of devices used may be based on the compressibility of the block of data when it was originally written to the memory devices. Furthermore, the specific devices used may depend on the mapping that is based on the particular address being used to store the line.

What should be understood is that determining how much compression was used on the block of data allows for automatic determination of the specific memory devices used. For example, suppose it is determined that a block of data was compressed to 32 bytes. This means that a total of 40 bytes may have been used to store the block (e.g. 32 bytes for the compressed data and 8 bytes for the ECC). Once the total number of bytes is determined, the mapping, such as the mapping described with respect to FIG. 6, may be used to determine which memory devices were used to store the bytes.

Thus, if the prediction is accurate, the actual memory devices used may be determined. Because the actual memory devices used is known in advance, only those memory devices need be read. In cases where the number of devices to be read is less than the total number of devices, there can be a savings in read energy. As mentioned above, energy is used upon reading each device. If the number of devices read is reduced, the amount of read energy may be reduced.

The data block compression prediction circuit may utilize several different techniques in predicting the compression of the data block to be read. Some possible techniques are described in further detail with respect to FIG. 11. In general, data may be maintained that may be used to aid the prediction circuit 1016. With some techniques, the accuracy of a prediction may be used to update the data. In other techniques, as the blocks of data are written, data related to the compression, to be used later by the compression prediction circuit, may be stored. The compression prediction update circuit 1017 may be used to update the data used by the compression prediction circuit. Operation of the compression prediction update circuit is described in further detail with respect to FIGS. 11-13.

It should be noted that in some cases the prediction of the compression of a block of data may be incorrect. In such cases, the data block compression/decompression circuit may be unable to successfully decompress the block of data. In such cases, the remainder of the memory devices may be read, and the data block may be decompressed as described above. In some implementations, the data retrieved form the devices based on the prediction need not be re-read if the prediction was inaccurate. For example, if the prediction was that devices 1-5 were used, but the prediction was incorrect, devices could then be read. There would be no need to re-read devices 1-5. In other cases, the prediction may be incorrect causing more devices than needed, though still less than all of the devices, to be read. The data from the unneeded devices may simply be ignored. Power savings may still be achieved, as the complete set of devices was not read.

Figure 11:
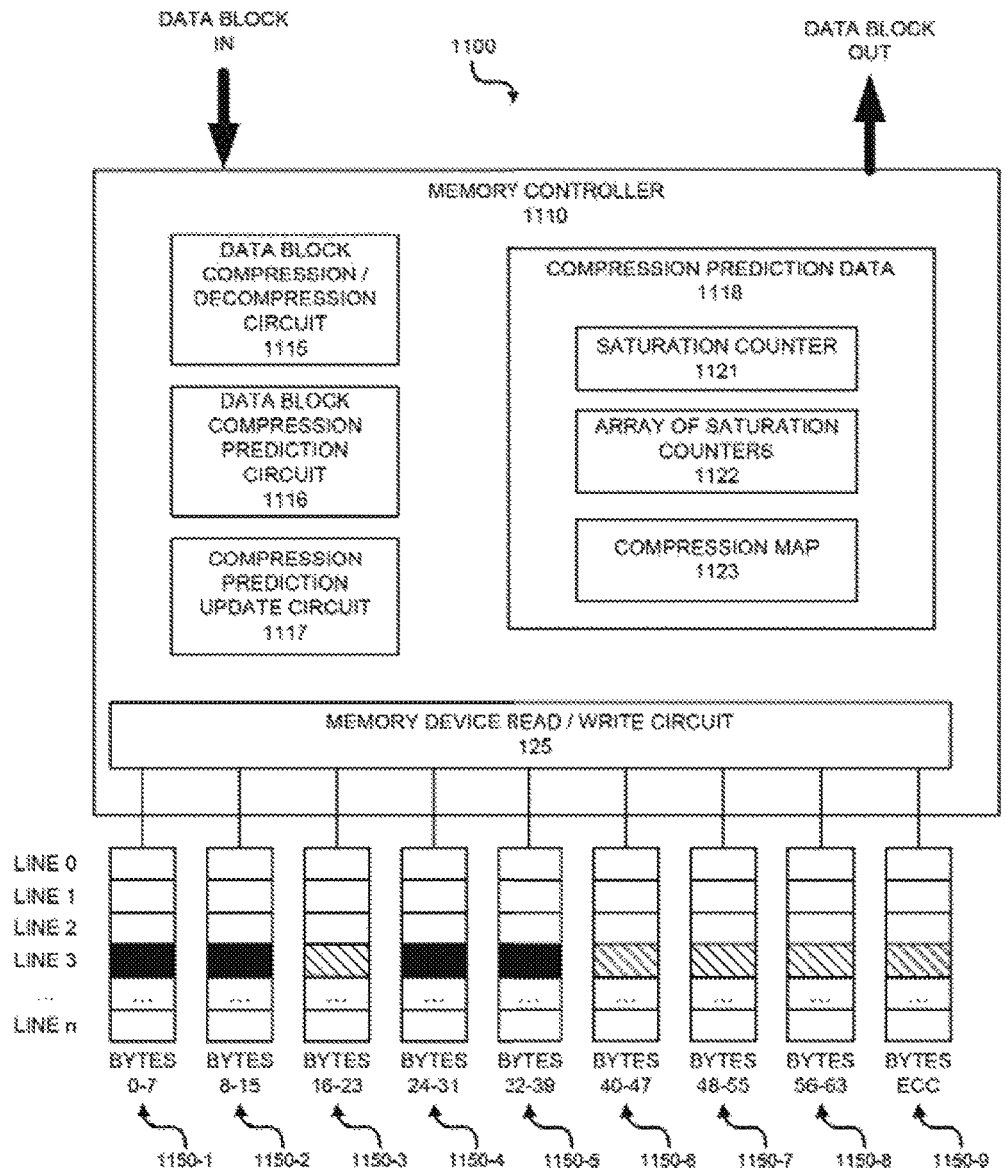
FIG. 11 depicts another example system including retrieve data blocks from determined devices techniques described herein.

FIG. 11 depicts another example system including retrieve data blocks from determined devices techniques described herein. FIG. 11 includes all the elements previously describe with respect to FIG. 10. For example, the data block compression/decompression circuit 1115 is essentially equivalent to the similarly named element 1015 in FIG. 10. The remaining elements of FIG. 10 are similarly named and numbered in FIG. 11. For purposes of clarity of description, the description of those elements is not repeated here.

FIG. 11 may also include compression prediction data 1118. The compression prediction data may include saturation counter 1121, array of saturation counters 1122, and compression maps. It should be understood that the compression prediction data described are merely examples based on various implementations. Each implementation may not include all the described types of compression prediction data. Furthermore, other example implementations are also possible. The techniques described herein are not limited to the example implementations described.

The compression prediction data 1118 may include a saturation counter 1121. As will be described in further detail below, a saturation counter may be used to determine the likelihood that the next block to be read has a certain level of compression, based on previously read blocks of data. The saturation counter may be incremented or decremented by the compression prediction update circuit 1117 when a prediction is successful or unsuccessful respectively. For example, the saturation counter may be incremented upon a successful prediction and decremented upon an unsuccessful prediction. Use of the saturation counter 1121 is described in further detail with respect to FIG. 13*b*.

The compression prediction data 1118 may include an array of saturation counters 1122. Each counter in the array of saturation counters may be similar to saturation counter 1121. However, each counter in the array may be associated with a particular history of memory accesses. For example, instead of determining the compression based solely on the previously read blocks, the compression may be determined by first determining the previous pattern of compression of blocks that are to be read. Then, the saturation counter for that pattern may be used to determine the likely compression given that the pattern has reoccurred. In other words, a plurality of saturation counters may be maintained. Each saturation counter may be associated with a historical access pattern. Each saturation counter may be incremented upon a successful prediction and decremented upon an unsuccessful prediction for the associated historical access pattern. The compression prediction update circuit 1117 may be used to update the array of saturation counters. Use of the array of saturation counters 1122 is described in further detail with respect to FIG. 13*c*.

The compression prediction data 1118 may include a compression map 1123. The compression map may indicate the actual compression used for each data block. The compression prediction update circuit 1117 may be used to update the compression map based on compression of the data blocks. Use of the compression map 1123 is described in further detail with respect to FIG. 13*d*.

Figure 12:
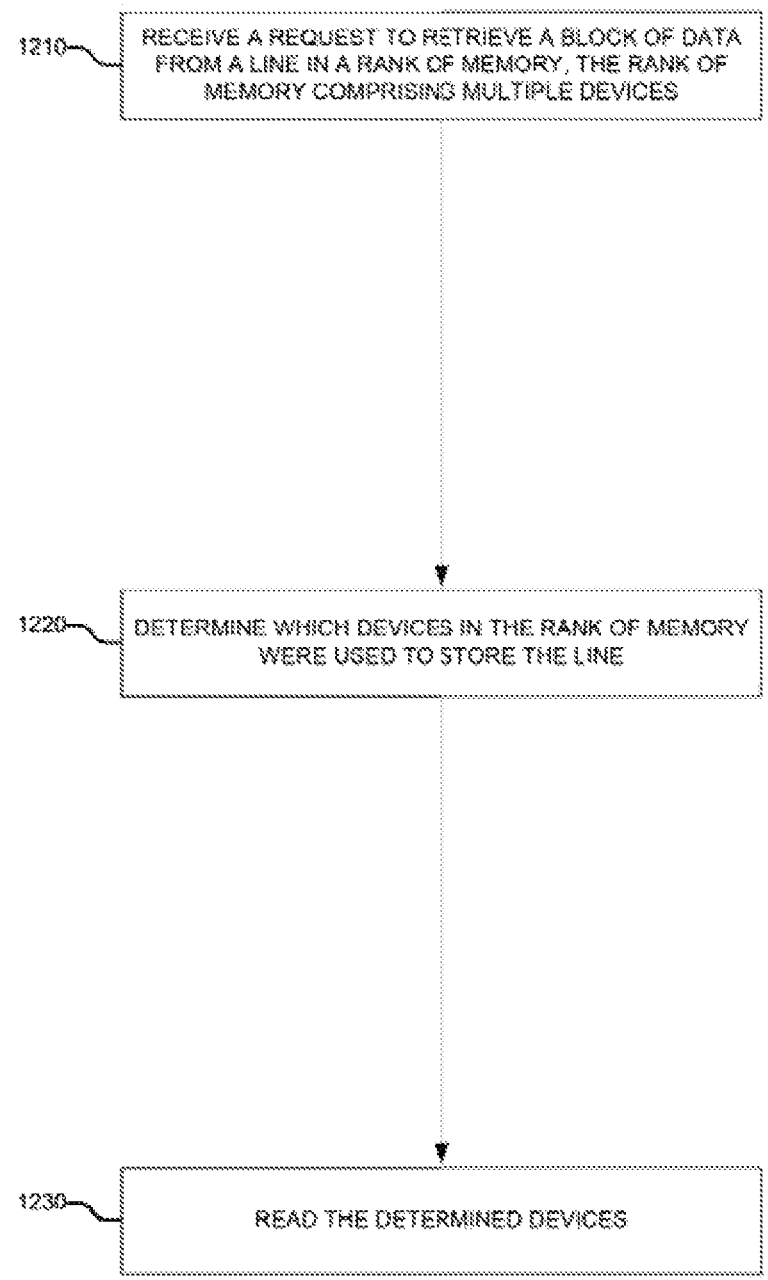
FIG. 12 is an example high level flow diagram for retrieving data blocks from determined devices according to techniques described herein.

FIG. 12 is an example high level flow diagram for retrieving data blocks from determined devices according to techniques described herein. In block 1210, a request to retrieve a block of data from a line in a rank of memory may be received. The rank of memory may comprise multiple devices. In other words, a request to retrieve a block of data that was previously stored according to techniques describe above may be received. That block of data, when originally stored, may have been compressed.

In block 1220, it may be determined which devices in the rank of memory were used to store the line. In other words, the compression of the line may be determined. In some implementations, the determination is made based on reading data about the compression that was stored at the time the block of data was originally compressed and stored in the rank of memory. In other implementations, the determination may be made by predicting the compression that was used.

In block 1230, the determined devices may be read. As explained above, energy is used to read each device. If the number of devices read is reduced, the amount of energy to read the block of data is reduced. By determining which devices were used to store a block of data in advance, only those devices in the rank need to be read, instead of all of the devices in the rank. Because the total number of devices read may be reduced, the total read energy used may be reduced.

FIGS. 13(*a-d*) are another example high level flow diagram for retrieving data blocks from determined devices according to techniques described herein. FIG. 13*a* depicts the general flow of retrieving blocks of data from determined devices, while FIGS. 13(*b-d*) depict several example implementations. It should be understood that the implementations described in FIGS. 13(*b-d*) are simply examples, and are not intended to be limiting. The techniques described herein are usable with any implementation of a device determination technique.

In FIG. 13(*a*), in block 1305, just as in block 1210, a request to retrieve a block of data from a line in a rank of memory may be received. The rank of memory may comprise multiple devices. The process may then proceed to one of several example device determination implementations, indicated by the circles labeled b, c, and d. Those implementation techniques are described in further detail below.

Once the devices have been determined, the process returns to block 1395. Just as above in block 1230, the determined devices may be read. Again, just as above, if a reduced number of memory devices is determined, the amount of read energy used, in comparison to reading all of the devices in the rank of memory, is reduced.

Figure 13A:
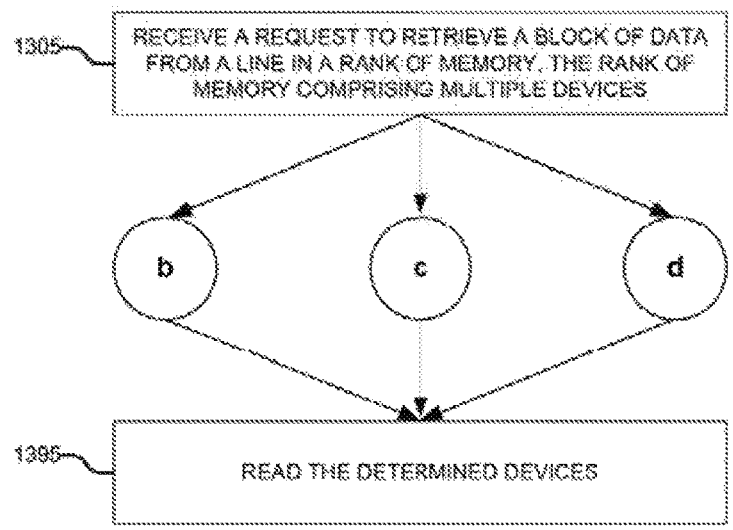
FIGS. 13(a-d) are another example high level flow diagram for retrieving data blocks from determined devices according to techniques described herein.
Figure 13B:
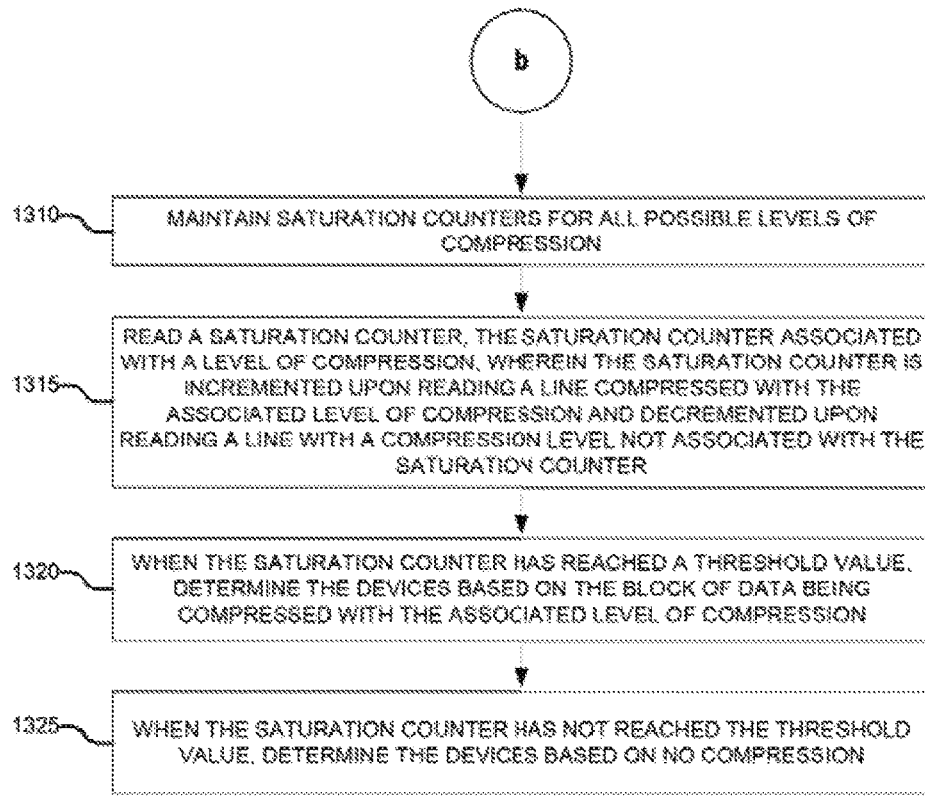

FIG. 13*b* depicts an example of an implementation of determining the devices used to store a block of data. In block 1310, a saturation counter may be maintained for all possible levels of compression. It should be noted that although the following description maintains a saturation counter for all possible levels of encryption, other implementations may maintain a smaller number of saturation counters without deviating from the scope of the techniques described herein.

A saturation counter may be a counter that is incremented upon each occurrence of an event, and decremented when the event does not occur. When the value of the counter reaches a threshold, the counter may be considered saturated. For example, a saturation counter may be maintained for blocks of data that were compressed to 40 bytes. Upon reading a block of data that was compressed to 40 bytes, the counter may be incremented. Upon reading a block of data that was not compressed to 40 bytes, the counter may be decremented. It should be clear that when the counter for 40 byte compression is incremented, any counters for other number of bytes of compression are decremented. The counter may have a value ranging from 1 to 10, with a threshold set at six. If the value of the counter is 6 or greater, the counter may be considered saturated, as it has reached the threshold. If the value of the counter is below 6, the counter may be considered not saturated, as it has not reached the threshold. The general description of a saturation counter described in this paragraph applies throughout the remainder of the disclosure.

In block 1315, the saturation counter (or each saturation counter if a separate counter is maintained for each possible level of compression) may be read. Each saturate counter reed may be associated with a level of compression. As explained above, the saturation counter may be incremented upon reading a line compressed with the associated level of compression, and the saturation counter may be decremented upon reading a line with a compression level not associated with the saturation counter.

In block 1320, when the saturation counter has reached a threshold value, the devices may be determined based on the block of data being compressed with the associated level of compression. In block 1325, when the saturation counter has not reached the threshold value, the devices may be determined based on no compression.

Blocks 1320 and 1325 may be better understood through the use of an example. For purposes of this example, assume there is only one saturation counter, and it is associated with blocks compressed to 40 bytes. In this example, each block is ether compressed to 40 bytes or is uncompressed. Assume that the counter ranges from 0 to 10, the threshold is set to 6, and the counter is initially zero. Upon receiving a request to retrieve the first block of data, the saturation counter is 0, thus it is determined the block is uncompressed, and as such, all devices are read. The decompression circuit may then decompress the block, as described above, and determine if the block was compressed or not. If the block was compressed, the saturation counter may be incremented (e.g. incremented to 1).

For purposes of this example, assume that the next 5 blocks read are also compressed. Because the saturation counter is not saturated, it is assumed that each of those blocks is not compressed, and all devices are read. Because each block was actually compressed, the saturation counter is incremented each time. Thus, after reading 6 compressed blocks, the saturation counter may now be equal to 6 (e.g. the threshold), and the counter is now saturated.

Assume the next block is also compressed. When the saturation counter is read, it is determined that the counter is now saturated. As such, the devices used to store the data block may be determined based on a block compressed to 40 bytes. Because of this assumption, a reduced number of devices are read, thus reducing the read energy used. Because the block is assumed to be compressed, the decompression is successful after having read the reduced number of memory devices. As above, the saturation counter is incremented again (e.g. to 7).

Assume the next block to be read is not compressed. When the saturation counter is read, the counter is determined to be saturated, so a reduced number of memory devices are read. However, because the block is assumed to not be compressed, the decompression fails. The remaining memory devices are then read. In addition, the saturation counter is decremented (e.g., back to 6). If the next block were also not compressed, the saturation counter would drop below the threshold, and would no longer be considered saturated. Thus, it would be determined that all devices would need to be read for the following data block.

What should be understood is that the saturation counter predicts the compression of the next block of data to be read based on the compression of the previous blocks of data. If the saturation counter is saturated, many of the previous blocks were compressed with the compression level associated with the counter. A threshold prevents an anomalous block that may not be compressed from always causing the counter to become unsaturated. Thus, once a counter has become heavily saturated (e.g. the value is significantly above the threshold), a rogue uncompressed block, although causing the counter to decrement, would not cause the counter to no longer be saturated. It should further be understood that the threshold may be set or modified while the system is running. For example, it may be possible that the combination of threshold and the pattern of compressed data results in the counter flip flopping between being saturated and unsaturated, causing prediction inaccuracy. In such a case, it may be beneficial to raise the threshold, to reduce the number of incorrect predictions.

Figure 13C:
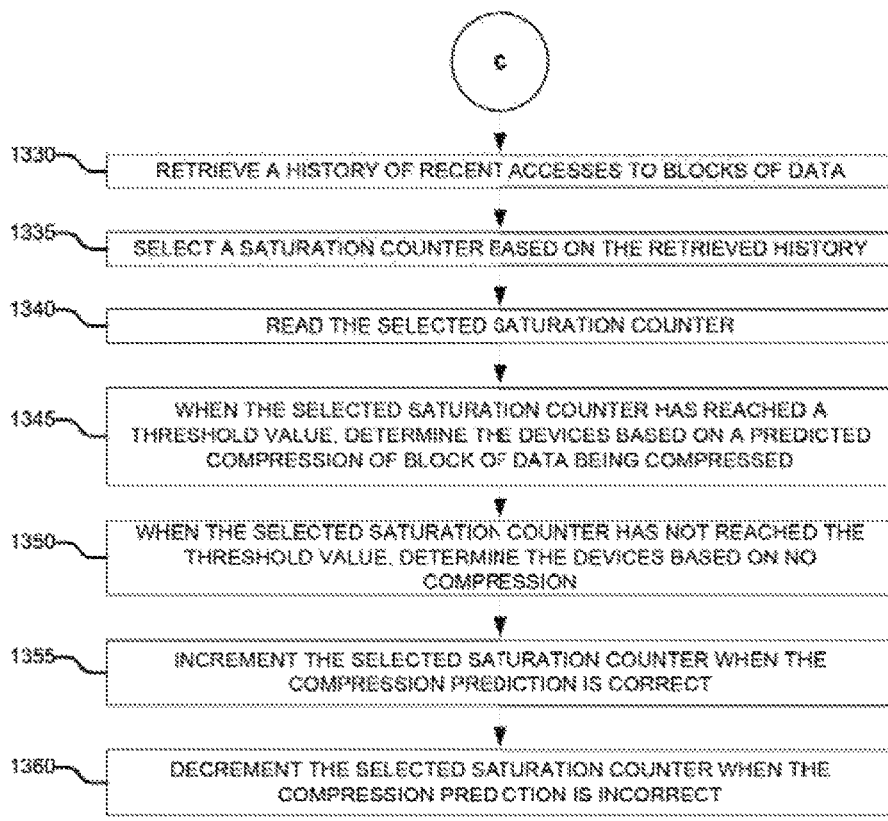

FIG. 13c depicts another example of an implementation of determining the devices used to store a block of data. The implementation described in FIG. 13c is similar to that described in FIG. 13b, however, rather than maintaining a single saturation counter for a given level of compression, a counter may be maintained for each historical access pattern of blocks of data.

In block 1330, a history of recent access to blocks of data may be retrieved. For example, the system may maintain a history of the last 10 blocks of data that were received. For simplicity of explanation, assume that a block can either be compressed or uncompressed. It should be understood that the techniques described herein are not limited to such a simplification and are suitable for use with maintain histories of all possible levels of compression. This simplification is merely an example and is in no way limiting.

In one implementation, the history may be represented by a 10 bit quantity, wherein a set bit indicates a compressed block and an unset bit indicates an uncompressed block. After a block is read and decompressed, the history may be updated based on the actual compression of the block of data. A 10 bit quantity results in 1024 possible values. For each of these values, a saturation counter may be maintained. The saturation counters may operate in a similar fashion to those described above with respect to FIG. 13b.

In block 1335, a saturation counter may be selected based on the retrieved history. In one example implementation, an array of saturation counters may be maintained, and the numerical value of the history (e.g. the one of the 1024 possible values) may be used to index into the array of saturation counters. The selected saturation counter used in a similar fashion as described above, but is limited to the access pattern that has been defined based on the recent history of accesses.

In block 1340, the selected saturation counter may be read. In block 1345, when the selected saturation counter has reached a threshold value, determine the devices based on a predicted compression of the block of data being compressed. In block 1350, when the selected saturation counter has not reached the threshold value, determine the devices based on no compression. In block 1355, the selected saturation counter may be incremented when the compression prediction is correct. In block 1360, the selected saturation counter may be decremented when the compression prediction is incorrect.

The selection of a saturation counter may be better understood by way of an example. Assume that a 10 bit history of access to data blocks is maintained and that a data block is either compressed or uncompressed. The history may initially be all zeros when the system is started. An array of 1024 saturation counters may be maintained. The saturation counters behave similarly to those described above. Upon the first memory access, the history may read all zeros (0000000000) resulting in a decimal value of zero. Thus saturation counter located at position zero may then be read. The block may then be processed as described above.

If the block turns out to have been compressed, the history may be updated by shifting the history to the left (dropping the leftmost bit) and inserting the result of the compression at the right most position. Thus, if the data block were compressed, the history would be updated to reflect the new history, 0000000001. The history may be updated as each data block is read. The saturation counters are thus associated with a specific history of accesses. In other words, each saturation counter tracks the likelihood of compression of the next block of data to be read based on the specific pattern of compression of previously accessed blocks of data. Assuming that at some point the access history reads 1111100000 (e.g. the last ten reads were 5 compressed blocks followed by 5 uncompressed blocks). The resultant decimal value would be 992 and thus the $992^{nd}$ counter (out of 1024) would be read.

Figure 13D:
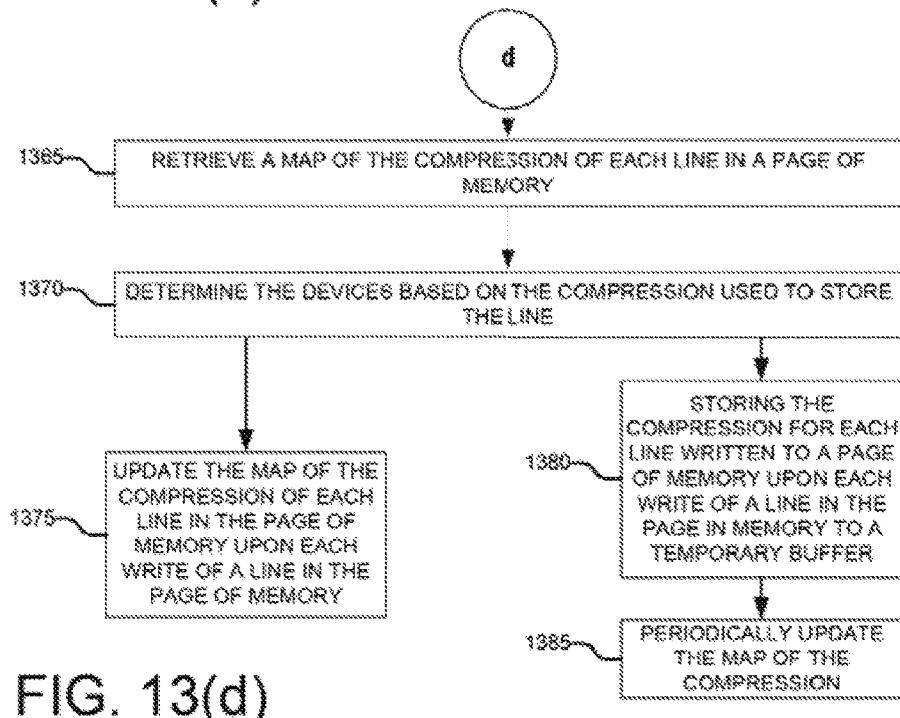

FIG. 13d depicts another example of an implementation of determining the devices used to store a block of data. The implementation described in FIG. 13d maintains a map of the compression used for each block of data. The map is maintained by the memory controller end does not utilize any support from the OS or any other software running on the system. In many systems, memory is managed in collections called pages. In one example implementation, a map may be maintained for each page of memory, the map containing the compression status for each block of data within the page. In some example implementations, the map may be stored in the unused bytes of a compressed block of data.

For example, if a block of data is compressed such that only 7 of the nine devices are needed to store the block of data, the remaining two devices may be used to store the map. In some implementations, the map may be stored in the unused portion of the first block of data stored on the page. In other implementations, the map may be stored in the unused portion of the first block of compressed data on the page (which may not necessarily be the first block of data on the page).

In block 1365, a map of the compression of each line in a page of memory may be retrieved. As mentioned above, the map may contain the compression status of each block of date on the page. In block 1370, the devices may be determined based on the compression used to store the line. As should be clear, the data store in the map should accurately reflect the compression of the blocks of data. Thus, in an implementations using a map, it can generally be assumed that the prediction will always be accurate, because the prediction is based on the map which stores the actual compression.

In order for the implementations that use a map to succeed, an accurate map may need to be maintained. In one implementation, each write of a line in a page of memory causes an update to the map. In block 1375, the map of compression of each line in the page of memory may be updated upon each write of a line in the page of memory.

In other implementations, a temporary buffer may be maintained to store the compression. The map may be periodically updated. In block 1380, the compression for each line written to a page in memory may be stored upon each write of a line in the page of memory. The storage may be to a temporary buffer. In block 1385, the map of compression may be periodically updated. For example, the temporary buffer may be written to the map.

The use of a map may be better understood by way of an example. In the present example, assume that a memory page is 4 Kilobytes long (e.g. 4096 bytes=64 uncompressed data blocks, each block being 64 bytes long). Further assume that a data block can either be compressed to 16 bytes, 32 bytes, 48 bytes, or uncompressed. With the inclusion of an 8 byte ECC, this means each data block will use 24 bytes, 40 bytes, 56 bytes, or 72 bytes respectively. Furthermore, assume that at least one data block is compressed. In this example, assume that the first data block is compressed (including ECC) to 56 bytes. This means that there are 16 bytes in the line that are unused.

Sixteen bytes of unused data=128 bits unused. With a 4 Kb page, there are 64 possible data blocks that can be stored per page. With 128 bits available, each data block may be allocated 2 bits to store the compression status of that data block. With two bits available, four statuses can be maintained (e.g. compressed 16, compressed 32, compressed 48, uncompressed). Thus, enough storage space is available to store the actual compression status of each data block.

It should be understood that the example presented is merely an example. The techniques described herein are not limited to the specific example presented above. What should be understood is that the techniques described herein allow for the use of the storage space saved by compression of data blocks to be used to store a map of the compression of all data blocks on the page.

We claim:
1. A method comprising:
receiving a request to retrieve a block of data from a line in a rank of memory, the rank of memory comprising multiple devices;
performing compression prediction to predict which devices from the multiple devices of the rank of memory were used for previously storing the requested block of data by predicting the number of devices of the rank of memory used for previously storing the requested block of data based on the compressibility of the requested block of data when it was originally written to the rank of memory and by mapping the compressibility of the requested block of data to particular addresses used to store the line;
determining which devices are to be read in relation to the previous storing in order to retrieve the requested block of data based on the compression prediction, wherein the determined devices are a subset of all of the multiple devices of the rank of memory; and reading the determined devices to retrieve the requested block of data.

2. The method of claim 1 wherein the performing compression prediction comprises:

reading a saturation counter, the saturation counter associated with a level of compression, wherein the saturation counter is incremented upon reading a line compressed with the associated level of compression and decremented upon reading a line with a compression level not associated with the saturation counter; and when the saturation counter has reached a threshold value, predicting that data compression has been carried out; and when the saturation counter has not reached the threshold value, predicting that data compression has not been carried out.

3. The method of claim 2 further comprising:

maintaining saturation counters for multiple possible levels of compression.

4. The method of claim 1 wherein the performing compression prediction comprises:

retrieving a history of recent accesses to blocks of data;

selecting a saturation counter based on the retrieved history;

reading the selected saturation counter;

when the selected saturation counter has reached a threshold value, predicting that data compression has been carried out; and when the selected saturation counter has not reached the threshold value, predicting that data compression has not been carried out.

5. The method of claim 4 further comprising:

incrementing the selected saturation counter when the compression prediction is correct; and decrementing the selected saturation counter when the compression prediction is incorrect.

6. The method of claim 1 wherein the performing the compression prediction comprises:

retrieving a map of compression of each line in a page of memory; and predicting whether the data compression has been carried out based on the map.

7. The method of claim 6 wherein the map of the compression is stored in an unused portion of a first compressed line of data in the page.

8. The method of claim 6 further comprising:

updating the map of the compression of each line in the page of memory upon each write of a line in the page of memory.

9. The method of claim 6 further comprising:

storing the map of the compression for each line written to a page of memory upon each write of a line in the page in memory to a temporary buffer; and periodically updating the map of the compression.

10. The system comprises:

a rank of memory, the rank of memory comprising a plurality of memory devices; and a memory controller, the memory controller to:

upon receiving a request to retrieve a block of data, perform compression prediction to predict which devices from the plurality of memory devices were used for previously storing the requested block of data by predicting the number of devices of the rank of memory used for previously storing the requested block of data based on the compressibility of the requested block of data when it was originally written to the rank of memory and by mapping the compressibility of the requested block of data to particular addresses used to store the line;

determine which memory devices from the plurality of memory devices are to be read in relation to the previous storing in order to retrieve the requested block of data based on the compression prediction, wherein the determined memory devices are a subset of all of the plurality of memory devices; and retrieve the requested block of data from the determined memory devices.

* * * * *